(12) United States Patent
Dowling et al.

(10) Patent No.: US 9,408,465 B2
(45) Date of Patent: Aug. 9, 2016

(54) METHOD AND DEVICE FOR WALL MOUNTING FLAT PANEL MONITOR AND STORING ASSOCIATED AUDIO/VIDEO COMPONENTS

(71) Applicant: Innovative Americans LLC, New Boston, NH (US)

(72) Inventors: James Dowling, New Boston, NH (US); Mark Fecteau, Wolfeboro, NH (US)

(73) Assignee: Innovative Americans, LLC, New Boston, NH (US)

( * ) Notice: Subject to any disclaimer, the term of this patent is extended or adjusted under 35 U.S.C. 154(b) by 0 days.

(21) Appl. No.: 14/713,160

(22) Filed: May 15, 2015

(65) Prior Publication Data

US 2015/0245712 A1 Sep. 3, 2015

Related U.S. Application Data

(63) Continuation-in-part of application No. 13/613,644, filed on Sep. 13, 2012.

(60) Provisional application No. 61/534,993, filed on Sep. 15, 2011.

(51) Int. Cl.
*F16M 13/02* (2006.01)
*A47B 97/00* (2006.01)
*A47B 96/02* (2006.01)
(Continued)

(52) U.S. Cl.
CPC ............... *A47B 97/001* (2013.01); *A47B 96/02* (2013.01); *F16M 11/10* (2013.01); *F16M 13/02* (2013.01); *H05K 5/0213* (2013.01); *H05K 5/0217* (2013.01); *F16M 2200/08* (2013.01); *Y10T 29/49947* (2015.01)

(58) Field of Classification Search
CPC ...... A47B 97/001; A47B 96/02; F16M 11/10; F16M 13/02; F16M 2200/08; Y10T 29/49947; H05K 5/0213; H05K 5/0217
USPC ........... 248/917–919, 921, 922, 285.1, 286.1, 248/287.1, 475.1, 476, 477, 489
See application file for complete search history.

(56) References Cited

U.S. PATENT DOCUMENTS 5,551,658 A * 9/1996 Dittmer ................. F16M 11/24 248/329
5,582,375 A 12/1996 Martin
(Continued)

OTHER PUBLICATIONS

Peerless Industires, Inc., Peerless Installation and Assembly: Wall Mount with Game Console Storage, www.peelessmounts.com, Jan. 28, 2011, 13 pages.
(Continued)

*Primary Examiner* — Nkeisha Smith
(74) *Attorney, Agent, or Firm* — Loginov & Associates, PLLC; William A. Loginov

(57) ABSTRACT

A mounting device for a flat panel monitor. The mounting device comprises a front panel and a mating second rear panel for connection with one another to form a housing. At least the front panel has a plurality of mounting apertures therein for securing the housing to a desired flat panel monitor while the rear panel has a mounting mechanism which facilitates attachment of the housing to a desired support surface. An internal recess is formed between the front panel and the rear panel, when assembled with one another, and the internal recess is sized for accommodating and retaining at least one peripheral electronic device therein.

19 Claims, 28 Drawing Sheets

(51) Int. Cl.
*H05K 5/02* (2006.01)
*F16M 11/10* (2006.01)

(56) References Cited

U.S. PATENT DOCUMENTS

| | | | |
|---|---|---|---|
| 6,119,997 A | 9/2000 | Van Lieshout | |
| 6,135,402 A | 10/2000 | Hatano et al. | |
| 6,166,910 A * | 12/2000 | Ronberg | E05B 73/0082 248/551 |
| 6,454,234 B1 | 9/2002 | Westbrook | |
| 6,665,175 B1 | 12/2003 | deBoer et al. | |
| 7,077,373 B1 | 7/2006 | Hoebener et al. | |
| 7,316,379 B1 * | 1/2008 | Graham | F16M 11/18 248/298.1 |
| 7,510,156 B1 | 3/2009 | Yaeger | |
| 7,641,163 B2 | 1/2010 | O'Keene | |
| 7,823,847 B2 | 11/2010 | Bremmon et al. | |
| 7,823,850 B1 | 11/2010 | Lam et al. | |
| 7,854,415 B2 | 12/2010 | Holbrook et al. | |
| 7,984,888 B2 * | 7/2011 | Park | F16M 11/10 248/274.1 |
| 7,997,211 B2 | 8/2011 | Peterson et al. | |
| 7,997,550 B2 | 8/2011 | Kuhn | |
| 8,025,264 B2 * | 9/2011 | Cheng | H05K 5/0204 248/201 |
| D648,161 S | 11/2011 | Truckor | |
| 8,109,485 B2 | 2/2012 | VanLanen et al. | |
| 8,235,341 B2 * | 8/2012 | Taylor | F16M 11/10 248/201 |
| 8,276,862 B2 | 10/2012 | Eshita et al. | |
| 8,322,673 B2 * | 12/2012 | Sculler | F16M 13/02 248/317 |
| 8,353,490 B2 | 1/2013 | Spinelli | |
| 8,356,779 B2 | 1/2013 | Stengel | |
| 8,369,103 B2 * | 2/2013 | Mitsuhashi | F16M 11/00 248/917 |
| 8,418,861 B1 | 4/2013 | Weaver et al. | |
| 8,540,109 B1 * | 9/2013 | McPeek | A45C 13/02 190/36 |
| 8,550,415 B2 * | 10/2013 | Sculler | H05K 5/0017 248/291.1 |
| 8,567,735 B2 * | 10/2013 | Burgess | F16M 11/04 248/280.11 |
| 8,616,136 B2 | 12/2013 | Burgess et al. | |
| 8,727,293 B2 * | 5/2014 | Tait | G09F 9/33 248/309.1 |
| 8,783,633 B2 * | 7/2014 | Truckor | F16M 11/30 182/82 |
| 8,833,713 B2 * | 9/2014 | Kitaguchi | F16M 11/048 248/220.21 |
| 8,888,062 B2 | 11/2014 | Novin | |
| 8,891,249 B2 * | 11/2014 | Stanek | F16M 11/10 248/276.1 |
| 8,905,496 B2 | 12/2014 | Burgess et al. | |
| 8,944,393 B2 * | 2/2015 | Mitsuhashi | G09F 7/18 248/220.22 |
| 9,027,893 B2 * | 5/2015 | Cheng | F16M 13/022 248/201 |
| 2004/0211870 A1 | 10/2004 | Bremmon et al. | |
| 2005/0035253 A1 * | 2/2005 | Rixom | F16M 11/04 248/284.1 |
| 2005/0263671 A1 * | 12/2005 | Lo | F16M 11/10 248/200 |
| 2006/0065800 A1 * | 3/2006 | Bremmon | F16M 11/10 248/274.1 |
| 2006/0214072 A1 | 9/2006 | Lee | |
| 2007/0041150 A1 * | 2/2007 | Short | F16M 11/2014 361/679.22 |
| 2007/0103605 A1 * | 5/2007 | Maruta | F16M 11/00 348/797 |
| 2007/0221807 A1 * | 9/2007 | Park | F16M 11/10 248/324 |
| 2007/0295870 A1 | 12/2007 | Peterson et al. | |
| 2008/0068784 A1 | 3/2008 | Bouissiere | |
| 2009/0200439 A1 | 8/2009 | Bremmon et al. | |
| 2009/0250564 A1 | 10/2009 | Glover | |
| 2012/0261362 A1 | 10/2012 | Skull et al. | |
| 2013/0299651 A1 | 11/2013 | McGowan et al. | |
| 2015/0264823 A1 * | 9/2015 | Shirley | F16M 13/02 248/287.1 |
| 2015/0316202 A1 * | 11/2015 | Chouinard | F16M 13/022 248/230.1 |

OTHER PUBLICATIONS

Peerless Industires, Inc., Peerless Installation and Assembly: Wall Mount with Game Console Storage, www.peelessmounts.com, Jan. 28, 2011, 5 pages.

* cited by examiner

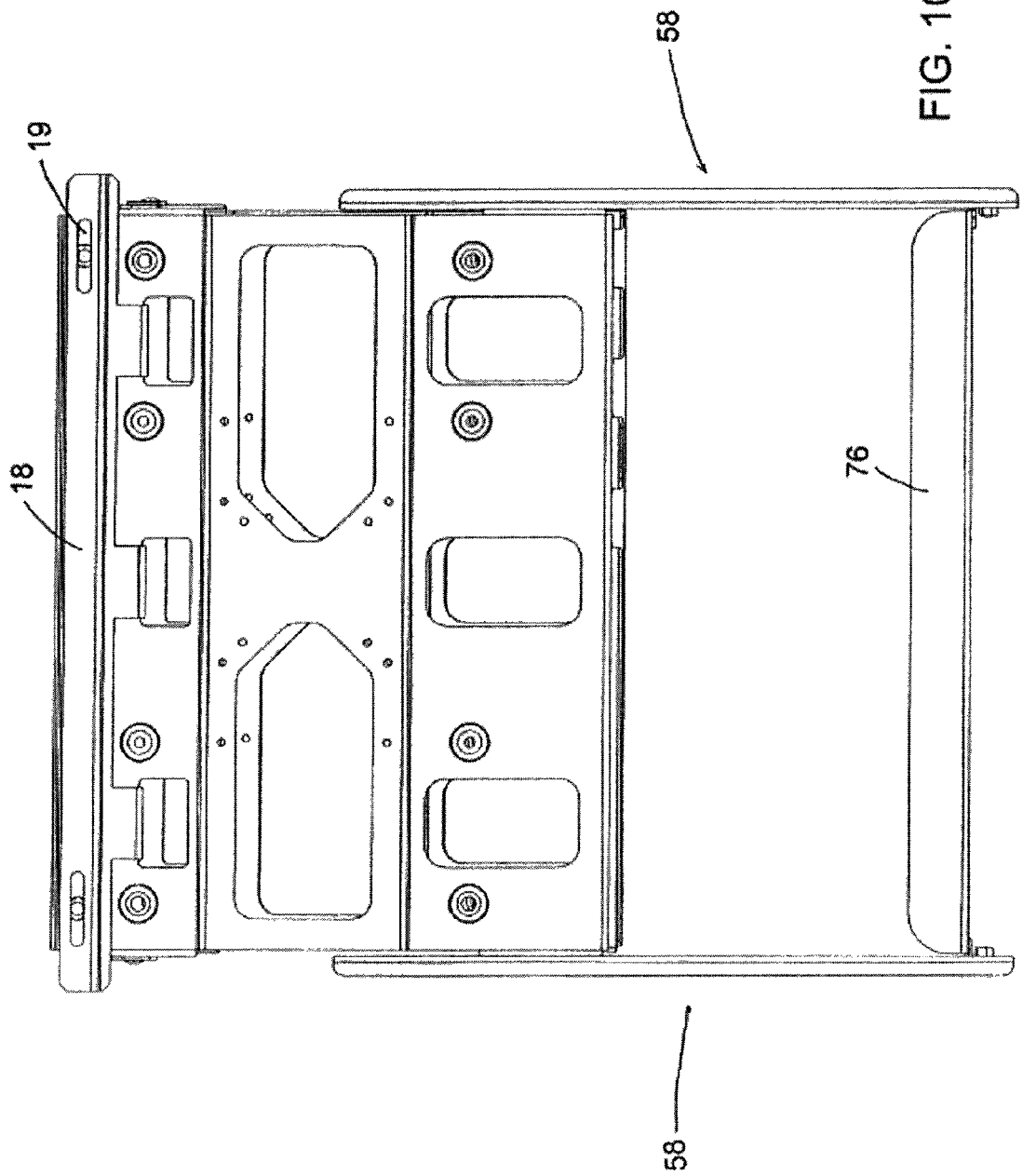

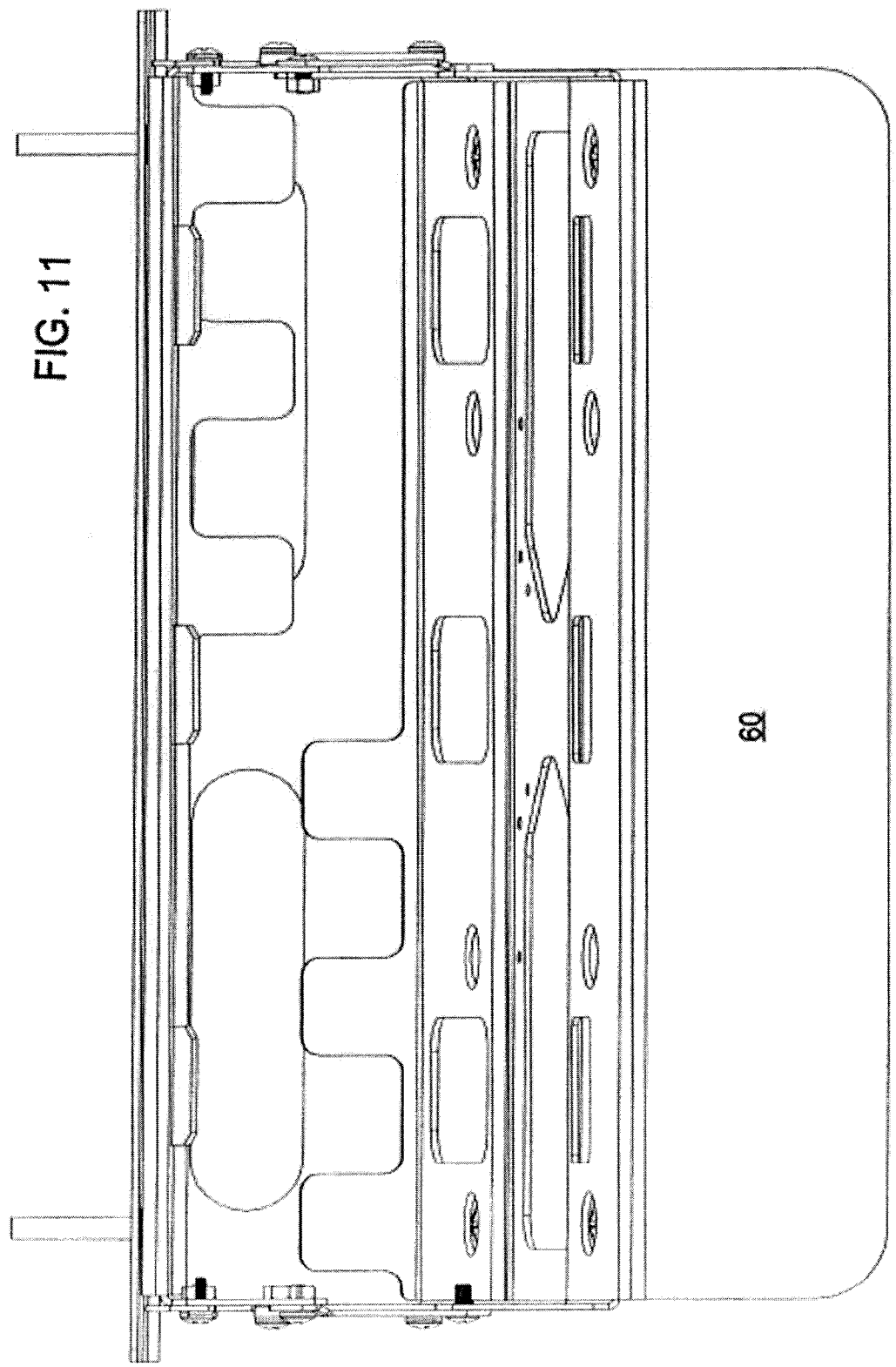

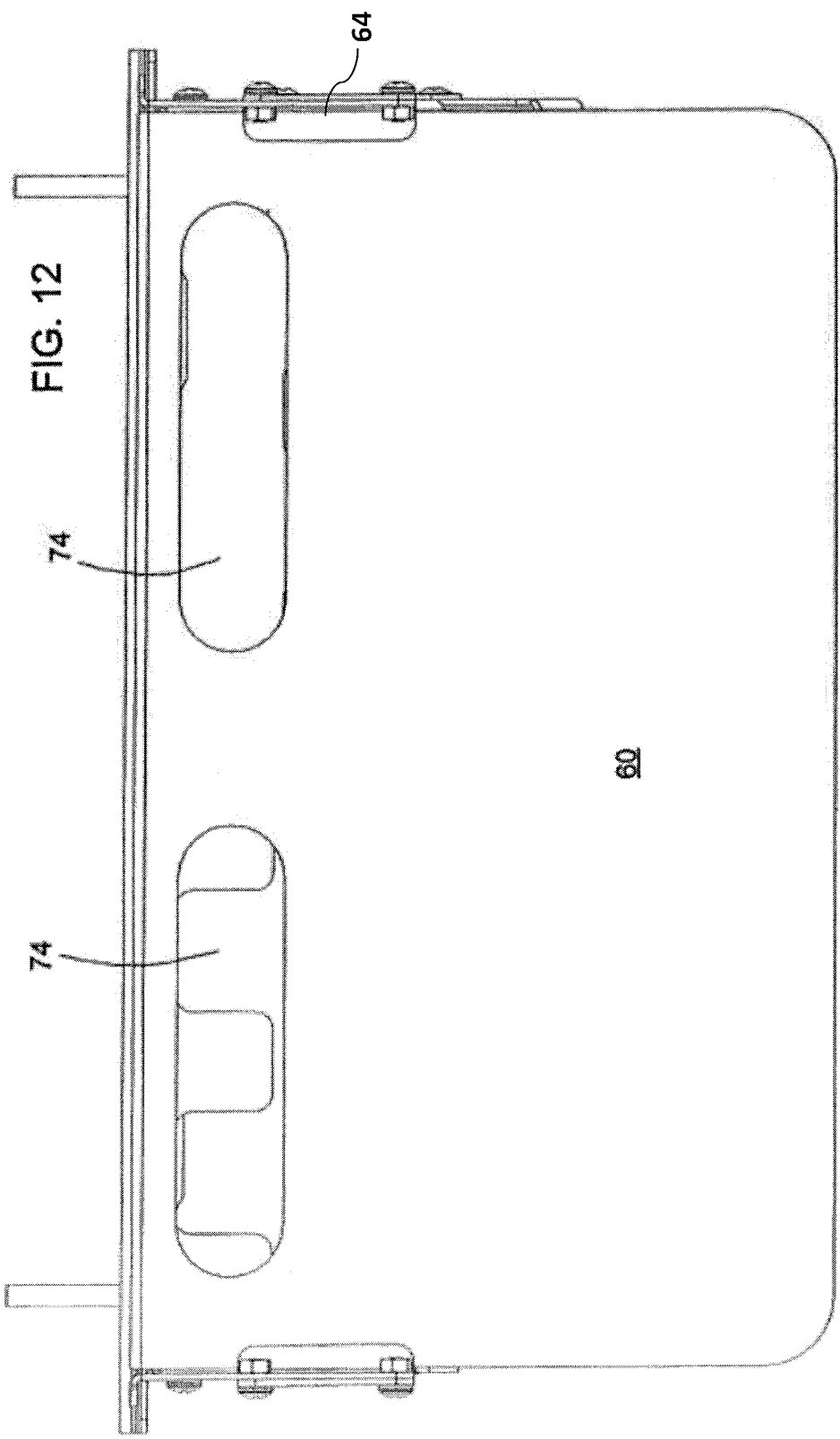

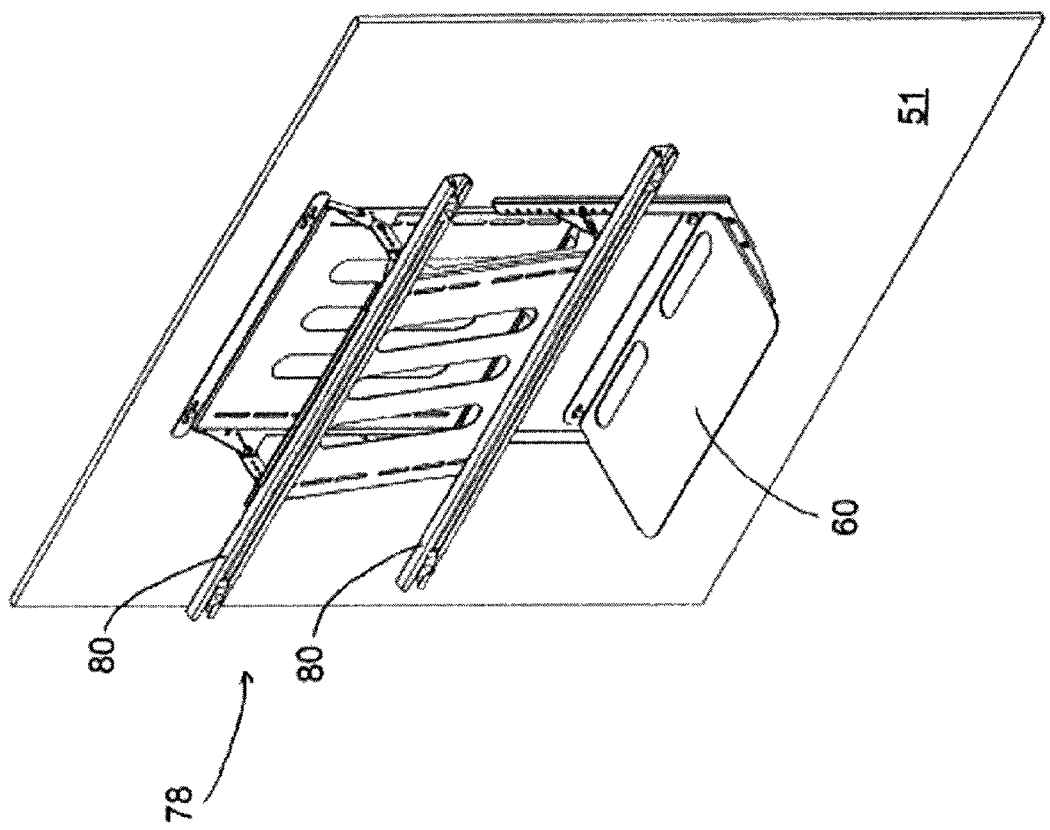

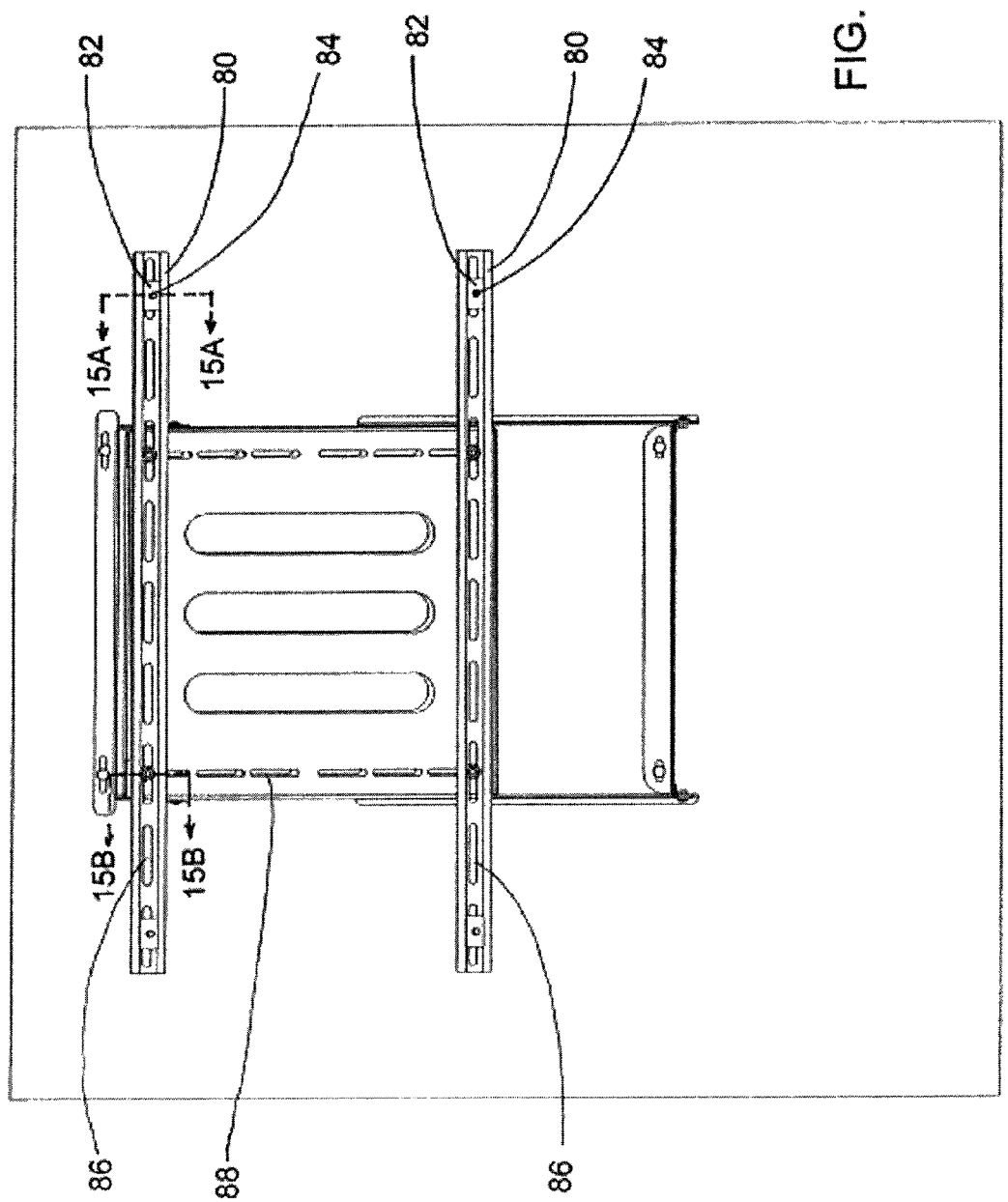

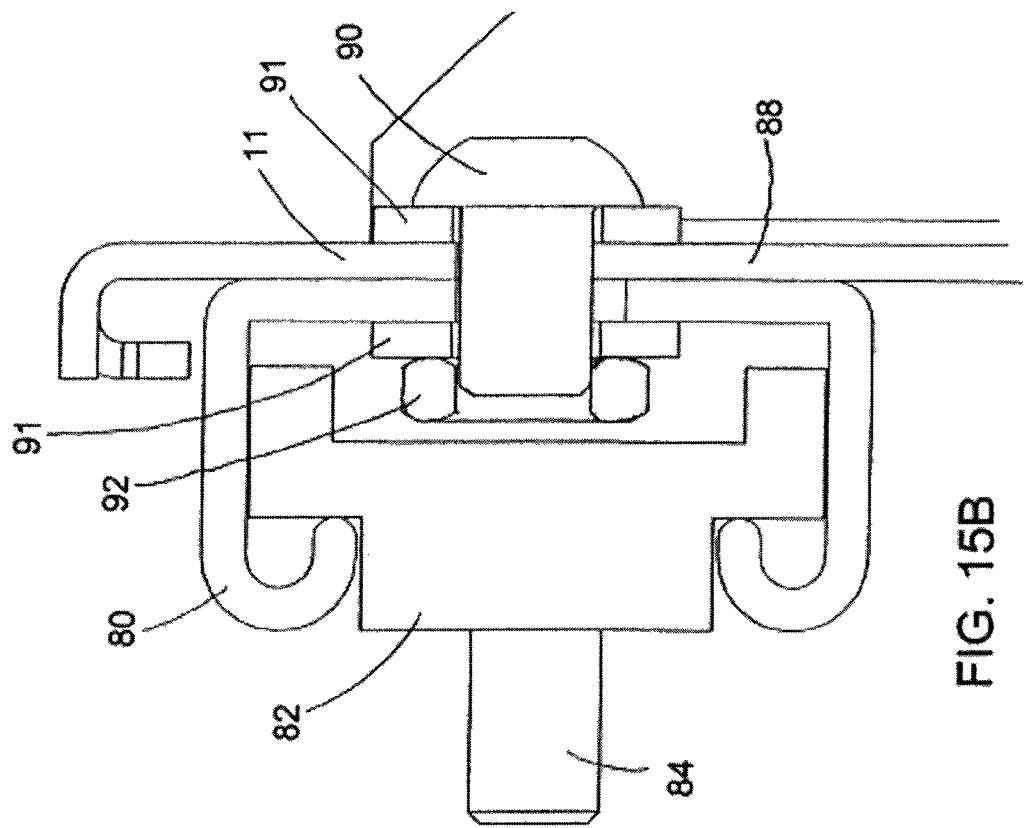
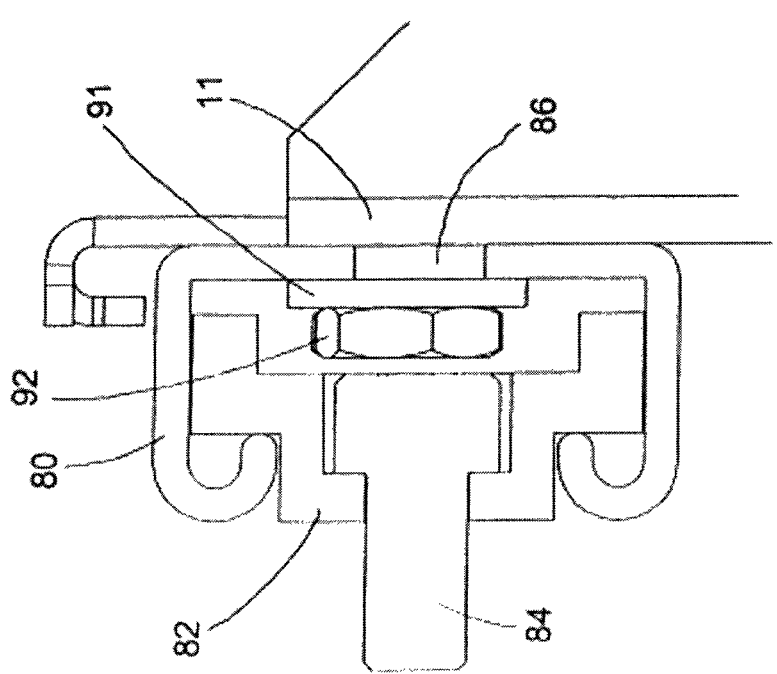
FIG. 15B
FIG. 15A

METHOD AND DEVICE FOR WALL MOUNTING FLAT PANEL MONITOR AND STORING ASSOCIATED AUDIO/VIDEO COMPONENTS

FIELD OF THE INVENTION

The present invention relates to a novel mounting device for accommodating various electronic components and/or accessories between the rear surface of a television and a desired supporting wall or other structure. More particularly, the present invention relates to attaching and supporting a flat panel monitor to a desired wall and/or other supporting structure with a mounting device which includes an internal recess for supporting and containing associated peripheral components and/or accessories typically used in conjunction with a flat panel monitor.

BACKGROUND OF THE INVENTION

A variety of different devices are currently available to facilitate mounting and/or supporting a flat TV panel monitor to a wall or some other supporting surface. However, such mounting devices for a flat panel monitor are generally cumbersome to install and typically do not provide space, e.g., an internal cavity or recess, for any peripheral electronic device or accessory, including but are not limited to, a HD box(es), a video network reception box(es) (i.e., Roku), a cable TV satellite box(es), a video game device(s) or console(s), e.g., a PlayStation® console or an X-box® console, a DVD player(s), a cable TV box(es), a Blu-ray player(s), a Wired or Wireless Internet Reception Device, etc.

Conventional devices that attach and support flat panel monitors consist of a panel or bracket that attaches directly to the rear or back surface of the monitor, and a panel or a bracket that attaches directly to a wall or structure with an arm or some other connecting component that pivotally secures these two panels or brackets to one another to allow a pivoting motion thereof. While these devices are adequate in their ability to support a flat panel monitor, they do not address the typical need to accommodate associated components typically used in conjunction with a flat panel monitor, as discussed above. Accordingly, typically an additional wall mounted shelf or floor standing article of furniture is normally required to contain and support such desired peripheral electronic component(s) or accessory. Further, the need for additional, external, accessory containment limits the possible placement location of the flat panel monitor as such additional wall and/or floor space must be considered. Further, a number of wires and cables are generally required in order to connect the flat panel monitor with the peripheral electronic component(s) or accessory and such wiring can be unsightly and/or objectionable.

SUMMARY OF THE INVENTION

Wherefore, it is an object of the present invention to overcome the above mentioned shortcomings and drawbacks associated with the prior art mounting devices for flat panel monitors.

Another object of the present invention is to provide a mounting device which easily mounts to a rear surface of the flat panel monitor, by utilizing a set of standard VESA mounting holes provided in the mounting device, and is also quickly and easily attached to the mounting surface so that the flat panel monitor can be easily and conveniently mounted by a single installer.

A further object of the present invention is to provide a mounting device in which the space located between opposed surfaces of the front and rear panels of the mounting device can be easily adjusted so as to facilitate accommodating different size peripheral electronic device(s), component(s) or accessory within the internal recess formed between the opposed panels of the mounting device or accommodate two or more desired peripheral electronic device(s), component(s) or accessory(ies) therein.

Yet another object of the present invention is to provide a plurality of ventilation openings, holes and/or other apertures within the housing of the mounting device so as to provide adequate cooling ventilation for the desired peripheral electronic device(s), component(s) or accessory to be accommodated within the internal recess of the mounting device and thereby facilitate adequate cooling of each desired peripheral electronic device(s), component(s) or accessory accommodated within the internal cavity and prevent overheating thereof while still providing a plurality of passages for any associated wiring, cable and other electronic connections.

A still further object of the present invention is to form the mounting device from two separate components which are substantially identical to or mirror images of one another so as to minimize associated manufacturing cost while still providing a rigid housing for accommodating the one or more desired peripheral electronic device(s), component(s) or accessory within the internal recess of the mounting device while still securely and permanently retaining the flat panel monitor mounted to the desired wall or other support structure.

Yet another object of the present invention is to provide a mounting device which can be either directly mounted to the wall or other support structure or mounted to a conventional mounting device which is directly mounted to the wall or other support structure and facilitate mounting a flat panel monitor to a desired wall or other support structure.

A further object of the present invention is to provide a mounting device in which the relative spacing between the front and rear panels of the mounting device can be readily altered or modified, with respect to one another, so as to provide the mounting device with a manual adjustment feature which provides the flat panel monitor with a desired tilt of from a few degrees or so (3.5 degrees) to as much as 10° of tilt.

A still further object of the present invention is to provide a mounting device which comprises a housing which is sufficiently closed on five sides thereof, namely, the front and rear sides, the left and the right sides, and the bottom side, and only opened on the top side thereof so as to facilitate access to the internal cavity of the mounting device and the peripheral electronic device(s), component(s) or accessory located therein to facilitate ease of installing or removing a desired peripheral electronic device(s), component(s) or accessory to and from the internal cavity of the mounting device.

Another object of the present invention is to provide the tabs of the front and rear panels with mating locking features so that adjacent tabs, one overlapped with one another, can interlock with one another and such interlocking feature of the tabs further increases the structural rigidity and integrity of the housing formed by the two mating panels of the mounting device.

Another object of the present invention is to provide a mounting device having L-shaped brackets which are connected to the rear panel of the mounting device and which support a shelf for supporting a further peripheral electronic device(s), component(s) or accessory. The shelf is adjustable with respect to the mounting device and enables easy access to the further peripheral electronic device(s), component(s) or accessory.

A further object of the present invention is to provide a mounting device having universal mounting channels so as to facilitate accommodating flat panel monitors of different sizes. The channels further enable lateral adjustment of the flat panel monitor with respect to the mounting device.

The present invention also relates to a mounting device, for a flat panel monitor, comprising a front panel and a mating rear panel; the front panel and the rear panel being adjustably connectable with one another by at least two side tabs; at least one retaining feature extending from a lower portion of at least one of the front and the rear panels toward another of the front and the rear panels to form a base for supporting at least one peripheral electronic device thereon, and the front panel, the rear panel, the at least one retaining feature and the at least two side tabs together forming a housing which defines an internal recess; at least the front panel having a plurality of mounting apertures therein for securing the housing to a desired flat panel monitor; a mounting bracket for attachment to a desired surface by at least one fastener; the rear panel of the housing having a hook which facilitates attachment of the housing to the mounting bracket desired support surface; a removable locking member, being received by the mounting bracket, for preventing the housing from becoming inadvertently separated from the mounting bracket; the housing being open on a top side thereof to facilitate insertion and removal of at least one peripheral electronic device therefrom; the housing being sufficiently closed, on a remaining five sides thereof, so as to facilitate retaining the at least one peripheral electronic device within the housing; and the internal recess being sized for accommodating the at least one peripheral electronic device therein, on the at least one retaining feature, between the desired flat panel monitor and the desired support surface.

BRIEF DESCRIPTION OF THE DRAWINGS

The invention will now be described, by way of example, with reference to the accompanying drawings in which:

FIG. 10 is a rear elevation view of the mounting device which illustrates features of the mounting device and the shelving unit.

FIG. 11 is a top view of the mounting device which illustrates the mounting device and shelving unit.

FIG. 12 is a bottom view of the mounting device which illustrates further details of the shelving unit.

FIG. 13 is a front perspective view of yet a further embodiment of the mounting device comprising the shelving unit and universal mounting channels secured to the mounting device, that is supported on a wall.

FIG. 14 is a front elevation view of the mounting device which illustrates the features of the mounting device, shelving unit and universal mounting channels.

FIG. 15A is a cross sectional diagram of the universal mounting channel viewed along the section line 15A-15A in FIG. 14.

FIG. 15B is cross sectional diagram of the universal mounting channel viewed along the section line 15B-15B in FIG. 14.

DETAILED DESCRIPTION OF THE INVENTION

Figure 1:
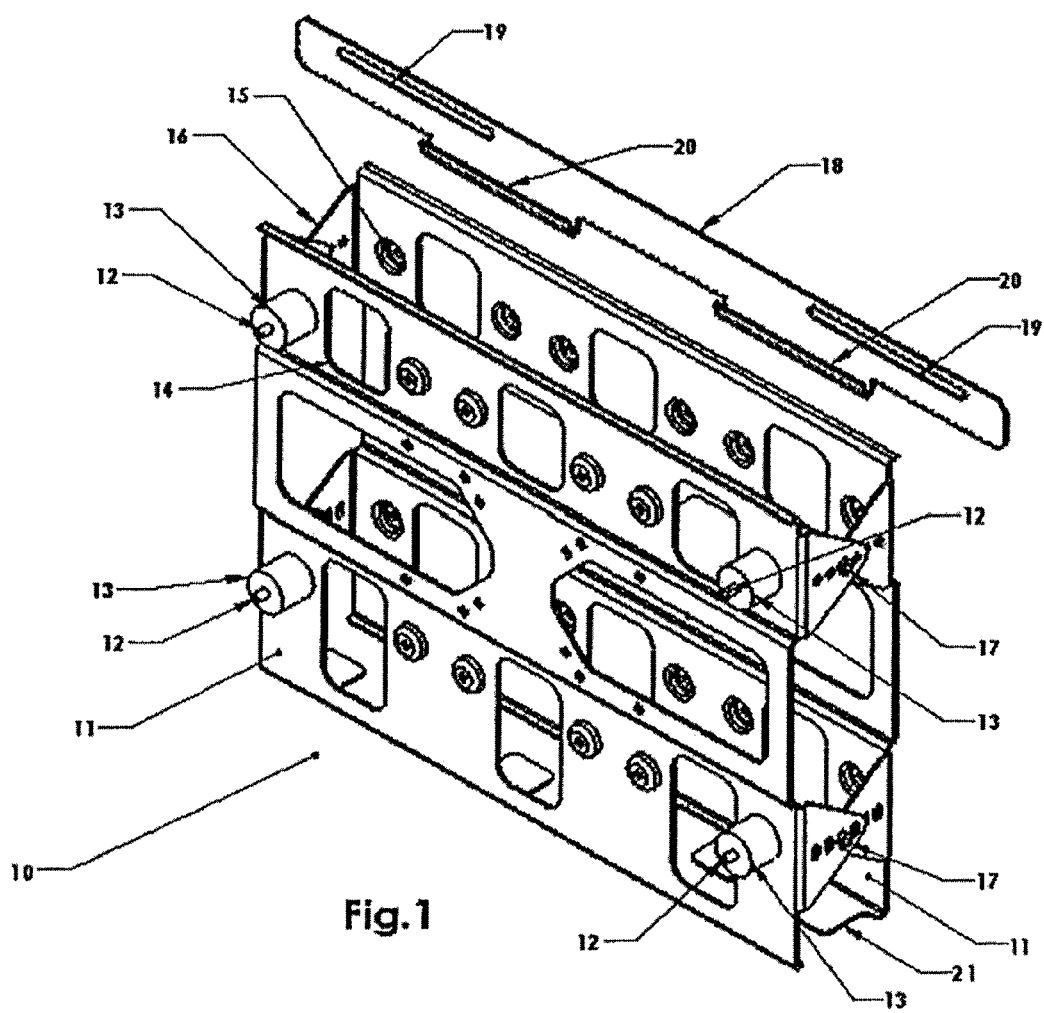
FIG. 1 is a perspective view of the mounting device according to the present invention along with a mounting bracket.

Turning now to FIG. 1, a brief description concerning the various components of the mounting device 2, according to present invention, will now be briefly discussed. As shown therein, the mounting device 2 comprises a generally rigid housing 10 which is formed by mating front and rear panels 11 each of which contains one or more horizontal supports and retaining features 21 which extend from one of the panels 11 toward the other panel and form a bottom side or base of the housing 10. Once the front and the rear panels 11 are assembled together with one another, as described below, and two sets of opposed pairs of end interconnection tabs 16 are securable to the mating tabs 16 of the other panel 11 by conventional hardware 17, a rigid housing 10, as shown in FIG. 1, is formed that will contain a desired peripheral electronic device(s), component(s) or accessory as will be described in further detail below. The horizontal support and retaining features 21 and the mating tabs 16 assist with captively retaining the desired peripheral electronic device(s), component(s) or accessory within the interior recess R of the housing 10.

The front and rear panels 11 and the housing 10, when the front and the rear panels 11 are assembled together with one another, each have a plurality of ventilation openings 14 which allow any accommodated desired peripheral electronic device(s), component(s) or accessory to be adequately ventilated during use and thereby prevent overheating of the desired peripheral electronic device(s), component(s) or accessory while accommodated within the housing 10. If necessary or desired, two or more spacers 13 can be attached, between the rear surface of the flat panel monitor 50 and the front surface of the mounting device 2, by utilizing conventional hardware 12 to adequately space the flat panel monitor 50 away from the mounting device 2 (see FIGS. 4 and 5) should the need arise to space the housing 10 from the flat panel monitor 50 by a further distance, e.g., to provide additional clearance and provide access to a cable jack(s) and some other electrical or cable connection(s) located on a bottom or a rear surface of the flat panel monitor 50.

Figure 2:
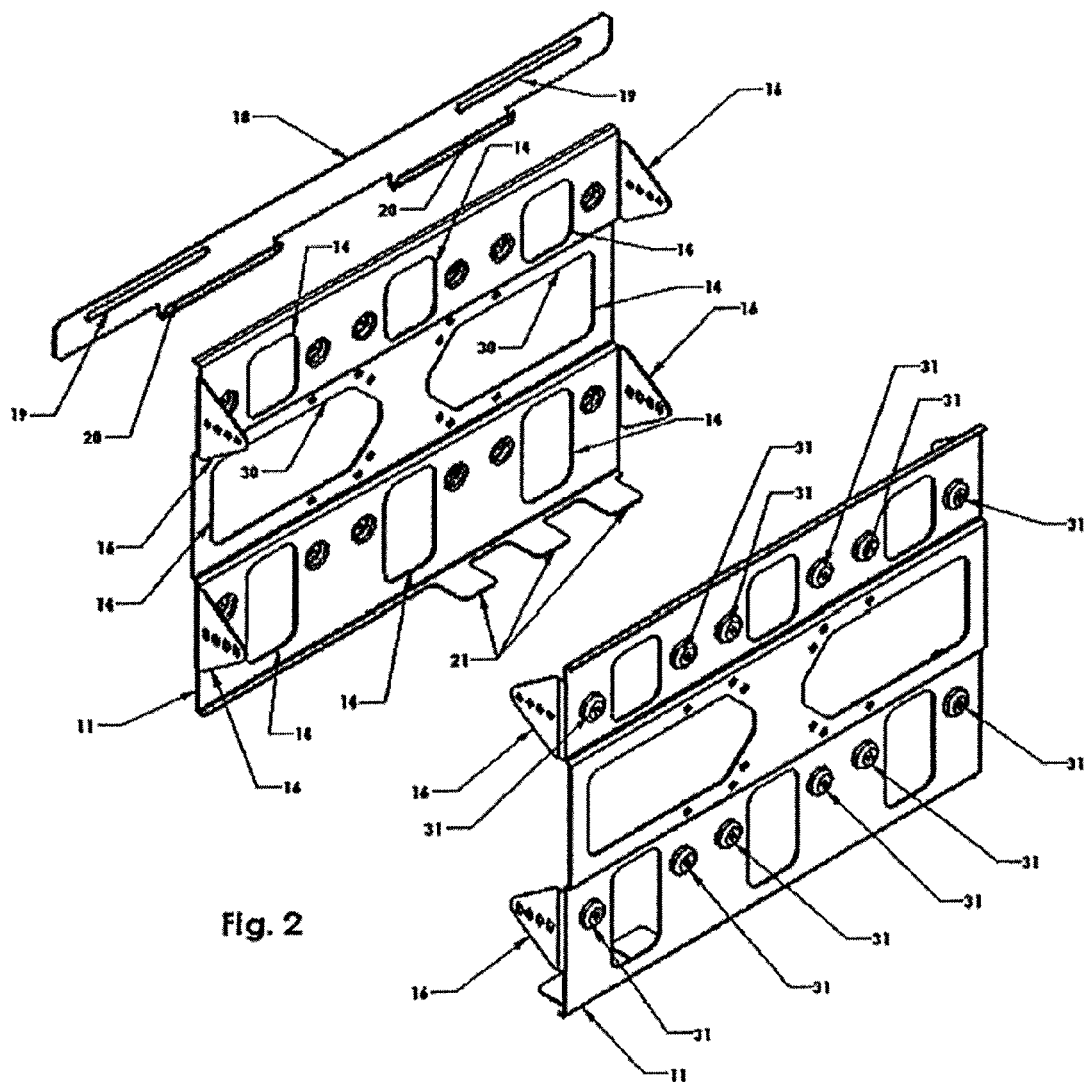
FIG. 2 is a perspective view of the mounting device with the individual components separated from one another to illustrate further details of the various components.

A plurality of mounting holes 15 and 40-45 are provided on at least the front panel 11 for attaching the mounting device 2 to a desired flat panel monitor 50, via conventional fasteners. The rear panel 11 may also be provided with a plurality of spaced apart mounting holes 15 and 40-45 which can be utilized for securing the mounting device 2 to a desired bracket, wall or some other mounting structure 51, via conventional fasteners. Alternatively, a mounting bracket 18 (see FIGS. 1, 2 and 5) can be used for hanging or supporting the mounting device 2, as well as the attached flat panel monitor 50, from the desired wall or some other structure 51. If the mounting bracket 18 is utilized, the mounting bracket 18 is first secured to a desired wall or some other structure 51 utilizing conventional and appropriate hardware which passes through the openings or slots 19 (see FIGS. 1 and 2), provided in the mounting bracket 18, for securing the mounting bracket 18 to the desired wall or some other structure 51. Once the mounting bracket 18 is securely attached to the wall or some other structure 51, the mounting device 2, along with the attached flat panel monitor 50, is then raised and placed over the hook elements 20 of the mounting bracket 18, as shown in FIG. 2. As generally shown in the drawings, each one of the front and the rear panels 11 preferably has a pair of spaced apart hanging openings 14 which are suitably sized for receiving a respective one of the hook elements 20 of the mounting bracket 18. Each of the pair of spaced apart hanging openings 14 has an elongate edge 30 which is sized to receive the hanging element 20 and permit hanging of the mounting device 2 on the mounting bracket 18, in a conventional manner, once the mounting bracket 18 is securely attached to a desired wall or other support structure.

During final installation, the flat panel monitor 50 is raised and the elongate edges 30 of the hanging openings of the rear panel 11 are suitably aligned with the respective hook elements 20 of the mounting bracket 18 for securely but releasably attaching and supporting the flat panel monitor 50 and the mounting device 2 to the mounting bracket 18. Such arrangement allows a single installer to first mount the mounting bracket 2 directly to the rear surface of the flat panel monitor 50 and thereafter mount the mounting bracket 18 directly onto the wall or some other structure 51, at a desired location, and finally hang the flat panel monitor 50 from the mounting bracket 18.

Still referring to FIG. 1, it is to be appreciated that a width of the housing 10 can be adjusted to a desired width so as to readily accommodate generally all currently available audio-visual components within the interior recess R, formed between the front and the rear panels 11 following assembly thereof with one another to form the rigid housing 10. The width of the interior recess R, i.e., associated with the spacing of the front and the rear panels 11 from one another, is easily and readily adjusted by suitably positioning holes of the tabs 16 of the front panel 11 with desired holes of the mating tabs 16 of the rear panel 11 and thereafter securing the four sets of overlapped tabs 16 with one another by using conventional hardware 17, e.g., nuts and bolts for example. Accordingly, the interior width of the cavity can be easily increased or decreased so as to more closely accommodate the desired peripheral electronic device(s), component(s) or accessory to be retained within the internal recess R of the mounting device 2.

Preferably both the front and the rear panels 11 as well as the mounting bracket 18 are all manufactured from a sufficiently strong and rigid material, such as a metal (e.g., aluminum or steel) or possibly a high strength plastic. The interconnection pieces and mating tabs 16 may be made from similarly sufficiently strong and rigid material of varying widths or made integrally with the front and rear panels 11. Additionally, the spacers 13 can be made from a sufficiently rigid and strong material such as a metal (e.g., aluminum or steel) or possibly a high strength plastic.

Referring now to FIG. 2, the mounting device 2 is shown, before assembly, comprising the front and the rear panels 11, as well as the associated mounting bracket 18. It is to be appreciated that the mounting bracket 18 may not be utilized in the event that the rear panel 11 of the mounting device 2 is to be secured directly to a conventional bracket or to the wall or some other structure 51. The front and the rear panels 11, when assembled as shown in FIG. 1, together form an enclosure or housing 10 which is suitable for accommodating and captively retaining the desired electronic device(s), component(s) or accessories and defines the internal recess R.

The front and the rear panels 11 are attached to one another by placing the tabs 16 on the front panel 11 adjacent to and overlapping the mating tabs 16 of the rear panel 11 (see FIG. 5 for example) and then passing a conventional fastener 17, such as a screw or a bolt, through the aligned apertures of the overlapped tabs 16 to fixedly secure the tabs 16 to one another and thereby form the rigid housing 10 once a mating nut is threaded onto the free end of each of respective screws or the bolts. The tabs 16 are structurally designed so as to support the weight of the flat panel monitor 50 as well as the desired peripheral electronic device(s), component(s) or accessory to be accommodated.

Figure 3:
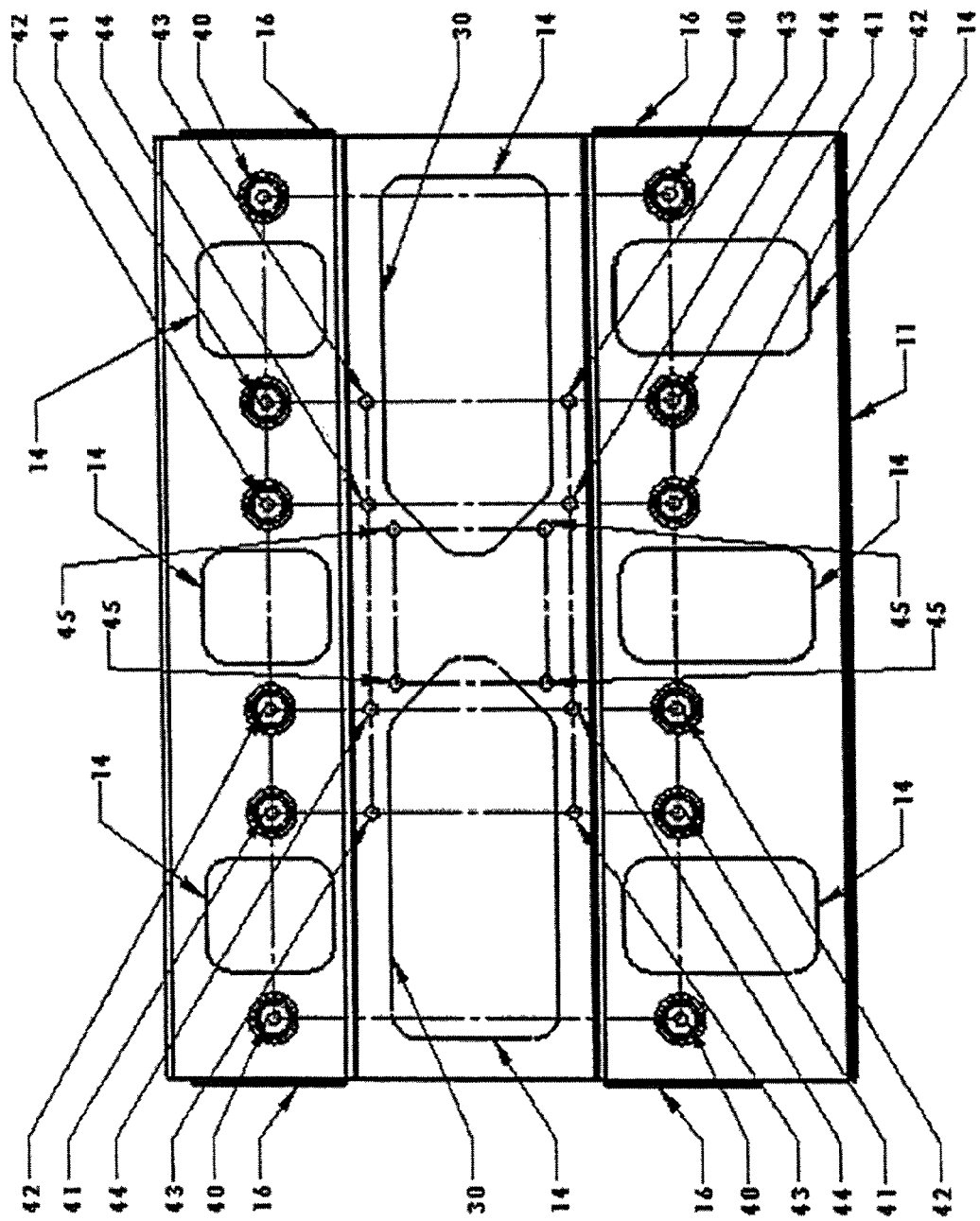
FIG. 3 is a front elevation view of the mounting device which illustrates the features of the components.

Referring now to FIG. 3, which illustrates one panel, e.g., the front panel 11, of the mounting device 2 having a variety of attachment possibilities for attaching a variety of different conventional flat panel monitors 50 thereto. For example, various sets of mounting holes of the present embodiment are suitable for various types of installations using the VESA standard. As is common knowledge, the VESA standard was developed so that flat panel monitor manufacturers can have a standard mounting procedure when mounting of a flat panel monitor is desired by a customer. For example, the set of mounting holes labeled with reference numerals 45 are suitable for an installation using the 75 mm×75 mm VESA standard; the set of mounting holes labeled with reference numerals 44 are suitable for an installation using the 100 mm×100 mm VESA standard; the mounting holes labeled with reference numerals 43 are suitable for an installation using the 200 mm×100 mm VESA standard, the set of mounting holes labeled with reference numerals 42 are suitable for an installation using the 100 mm×200 mm VESA standard, the set of mounting holes labeled with reference numerals 41 are suitable for an installation using the 200 mm×200 mm VESA standard; while the set of mounting holes labeled with reference numerals 40 are suitable for an installation using the 400 mm×200 mm VESA standard.

Figure 4:
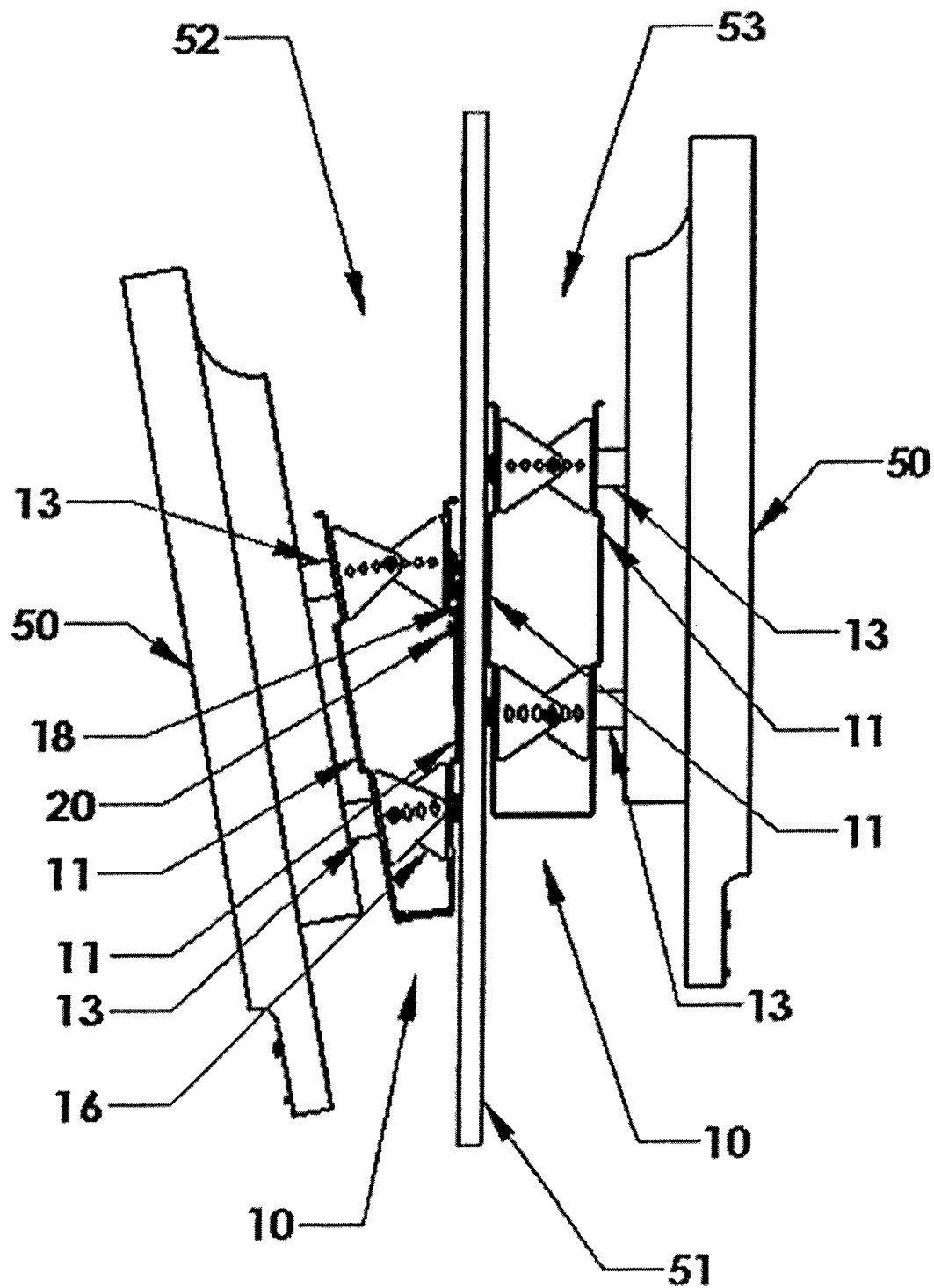
FIG. 4 is an side view, showing a wall located between two separate installations for flat monitors utilizing the mounting device according to the present invention.

Referring now to FIG. 4, this drawing illustrates two possible mounting configurations utilizing two of the mounting devices 2 according to the present invention. The right side 53 of that drawing shows the rear panel 11 of a first mounting device 2 secured directly to a wall or some other support structure 51 while the front panel 11 of the first mounting device 2 is secured to a first flat panel monitor 50. As shown, four spacers 13 (only two of which are shown in this drawing) provide additional clearance between the rear surface of the first flat panel monitor 50 and the first mounting device 2 for providing additional room for accommodating any associated wiring and cabling to be located between the flat panel monitor 50 and the desired peripheral electronic device(s), component(s) or accessory to be contained within the housing 10.

During installation, typically the first flat panel monitor 50 is arranged, screen side facing downward on the floor or some other assembly surface, and the front panel 11 then is attached to the rear surface of the first flat panel monitor 50 utilizing a desired one of the set of mounting holes 15, 40-45, depending upon the size of the flat panel monitor 50. Next, the second panel 11 then is attached to the wall or other support structure 51 utilizing desired one of the mounting holes 15, 40-45. The first flat panel monitor 50 is then raised, along with the attached first panel 11, and the tabs 16 of the front and the rear panels 11 are then suitable aligned and overlapped with one another and then conventional fasteners are passed through the aligned opening of the mating tabs 16 to securely attach the front and the rear panels 11 with one another and thereby form the rigid housing 10 which can closely accommodate and sandwich the desired electronic component(s) to be accommodated between the front and the rear panels 11. Lastly, the desired peripheral electronic device(s), component(s) or accessory to be accommodated by the first mounting device 2 is then placed through the access opening O and into and within the internal recess R and connected to the cable input and the first flat panel monitor 50 in a conventional manner.

The left side 52 of FIG. 4 illustrates a second possible mounting configuration utilizing a second mounting device 2 according to the present invention. This configuration shows the housing 10 of the second mounting device 2 hanging from the hook elements 20 of the mounting bracket 18 that was previously secured directly to the wall or other support structure 51 in a conventional manner, e.g., via a plurality of conventional fasteners and mounting components. The first panel 11 is first secured to the second flat panel monitor 50, as discussed above, utilizing the spacers 13 to provide additional clearance for any associated wiring and/or cabling between the flat panel monitor 50 and the component or components to be accommodated. Next, the second panel 11 is attached to the first panel 11 to form the housing 10 with the peripheral electronic device(s), component(s) or accessory, to be accommodated by the second mounting device 2, located therebetween. The second flat panel monitor 50 and the second mounting device 2 are then both hung from the mounting bracket 18 as described above.

The left side installation 52 differs from the right side installation 53 in that the spacing of the upper tabs 16 of the housing 10 utilize a different hole spacing than the lower tabs 16 such that the upper portion of the front panel 11 is spaced further away from the rear panel 11 than the lower portion of the front panel 11 which thereby results in an angular tilted installation for the second flat panel monitor 50, e.g., provides the second flat panel monitor 50 with a desired downward tilt.

Alternatively, an upper portion of the front panel 11 of the mounting device 2 can be spaced closer to the rear panel 11 than the lower portion of the front panel 11 which thereby results in the flat panel monitor being configured with a desired upward tilt (not shown).

Figure 5:
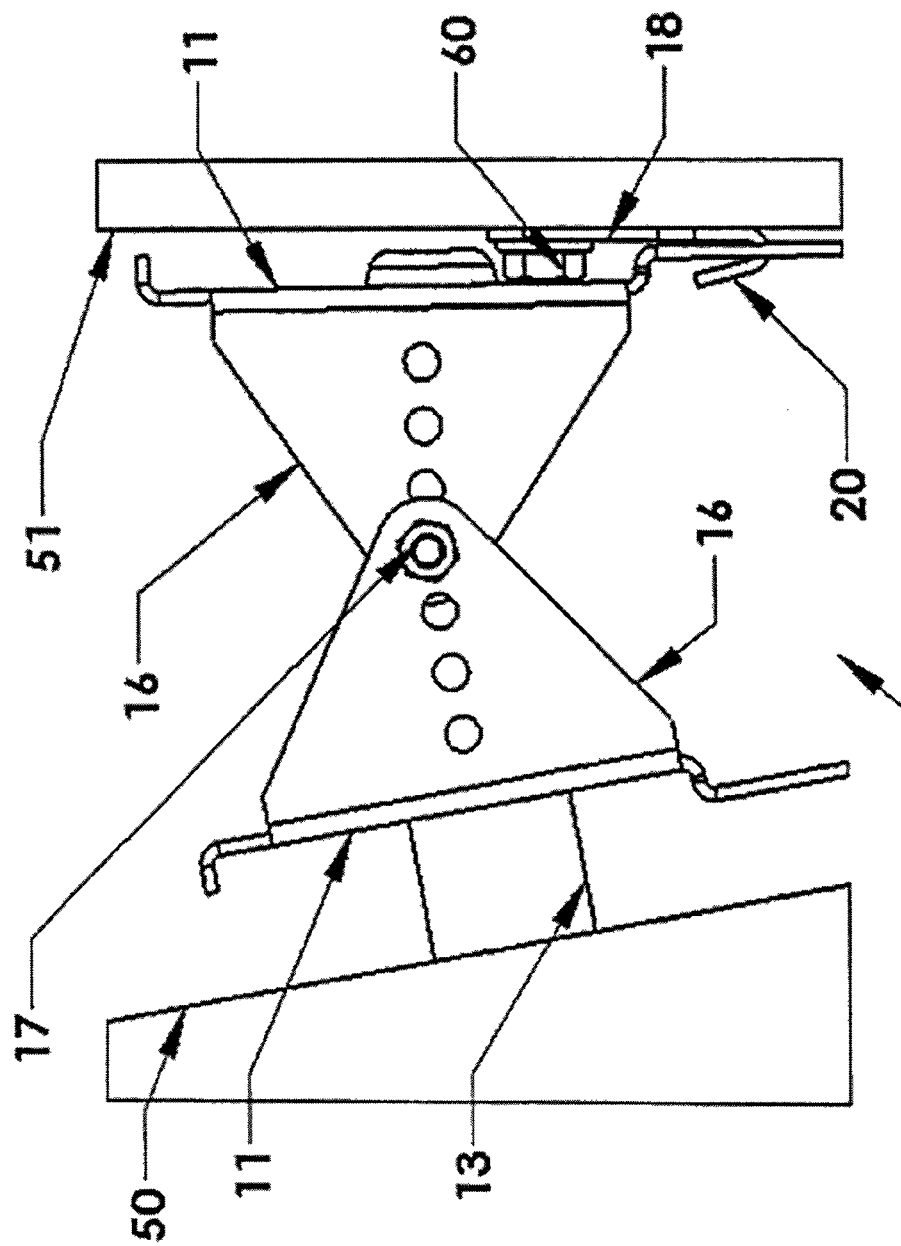
FIG. 5 is an enlarged side view of a section of FIG. 4 which illustrates details of the mounting component.

FIG. 5 is an exploded view of the upper portion of the left side configuration 52 from FIG. 4, illustrating further details of the upper portion of the angled assembly of the housing 10 and the installation of housing 10 utilizing the mounting bracket 18. As shown in this figure, during installation, the mounting bracket 18 is first secured to the wall or other support structure 51 using conventional hardware 60, e.g., a bolt or screw and a mating wall fastener. As shown, a rear panel 11 of the housing 10 hangs from the associated hook elements 20 of the mounting bracket 18 while the front panel 11 is attached directly to the flat panel monitor 50 utilizing conventional fasteners as well as four spacers 13. A desired tilt of the housing 10 as well as the flat panel monitor 50 is achieved by aligning desired holes of the adjacent and overlapped tabs 16 with one another and securing the overlapped tabs with one another using appropriate hardware 17. Multiple angle configurations, parallel and/or angled both up and down, can be achieved for the same flat panel monitor during or after installation.

Figure 6:
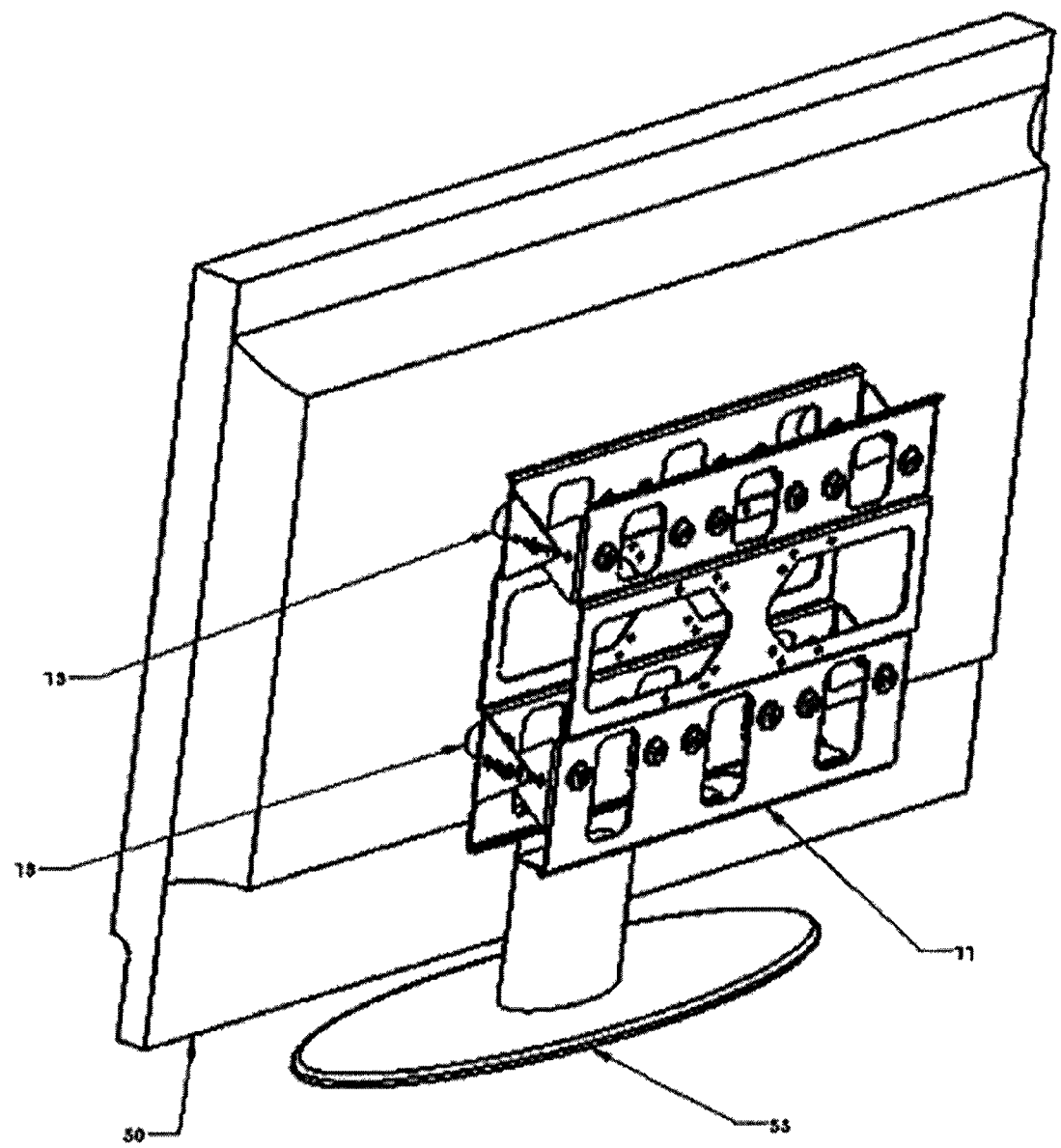
FIG. 6 is a rear perspective view showing the mounting device mounted to the rear surface of a flat panel monitor, supported by a base member, for accommodating or storing electronic device(s), component(s) or accessories to be located behind the flat panel monitor.

FIG. 6 illustrates the mounting device 2 on the rear surface of flat panel monitors 50 using a base member 55. As previously discussed in reference to FIG. 3, the mounting device 2 has a variety of attachment possibilities for attaching a variety of different conventional flat panel monitors 50 thereto. In most cases, the flat panel monitor 50 will be mounted to the mounting device 2 by utilizing standardized mounting holes 15. However, it is to be appreciated that most flat panel monitors also have a base member 55 for supporting the flat panel monitor 50 on a desired floor or furniture. When supported by the base member, the present invention is also applicable for accommodating or storing electronic device(s), component(s) or accessories behind the flat panel monitor. That is, the mounting device 2 can be attached to the rear surface of the flat panel monitor 50, in the manner discussed above, and so that the interior recess R can accommodate and thereby results in efficient storage of such electronic device(s), component(s) or accessory behind the flat panel monitor 50.

If desired, the inwardly facing surfaces of the front and the rear panels 11 can each be lined or covered with a soft, compressible material, such as foam, to prevent the mounting device 2 from scratching or otherwise damaging the peripheral electronic device(s), component(s) or accessory to be accommodated by the mounting device 2. Alternatively, the peripheral electronic device(s), component(s) or accessory, to be accommodated by the mounting device 2, can be wrapped or covered with a foam material to protect and avoid scratching or damage thereto.

Turning now to FIGS. 7 through 12, an attachment for use with the present invention will now be described. As can be seen in this embodiment, the attachment comprises a shelving unit 56 which is shown suspended below the housing 10 of the mounting device 2. The shelving unit 56 generally comprises a pair of spaced apart elongate L-shaped brackets 58 and a shelf 60 supported therebetween. Each of the elongate L-shaped brackets 58 comprises an elongate body 62 and an arm 64. Each elongate body 62 has a backing plate 66 located along a rear surface thereof for abutting against a wall when the mounting device 2 is secured to a wall or some other support structure 51.

The upper portion of elongate body 62 of the L-shaped bracket includes a plurality of attachment apertures 70 provided along the length thereof. At least one conventional fastener, e.g., a bolt or screw, passes through at least a desired one of the apertures 70 and is utilized for securing the upper portion of each elongate body 62 of the L-shaped brackets 58 to at least one of the lower most connection tabs 16 of the rear panel 11. The plurality of apertures 70 along the L-shaped bracket enable securing the shelving unit 56 to the housing 10 at a number of different relative spacing positions to facilitate supporting one or more other additional peripheral electronic device(s), component(s) or accessory on the shelving unit 56, once suitably suspended below the housing 10 of the mounting device 2.

Figure 7:
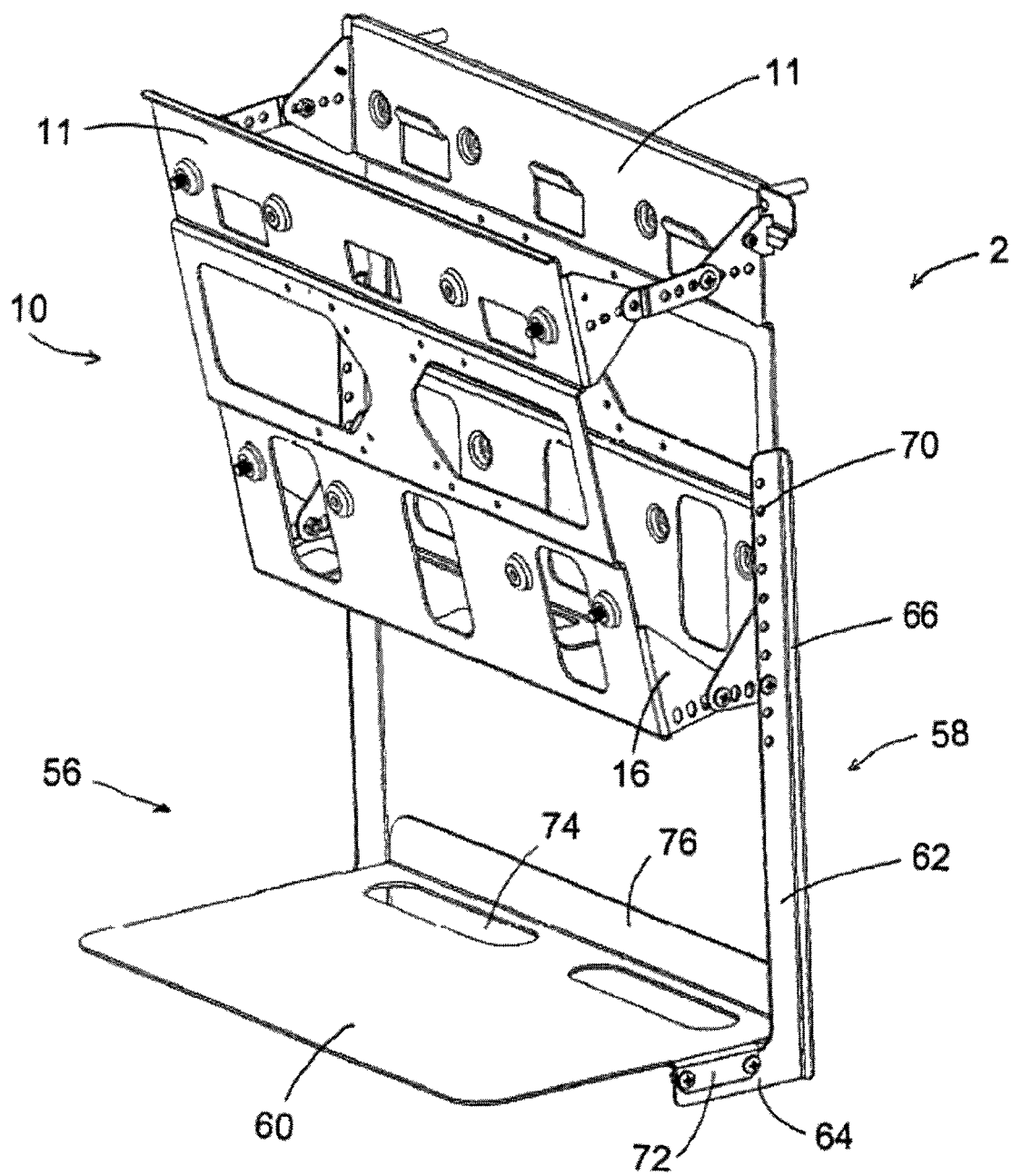
FIG. 7 is a front perspective view of another embodiment of the mounting device according to the present invention with a shelving unit.
Figure 8:
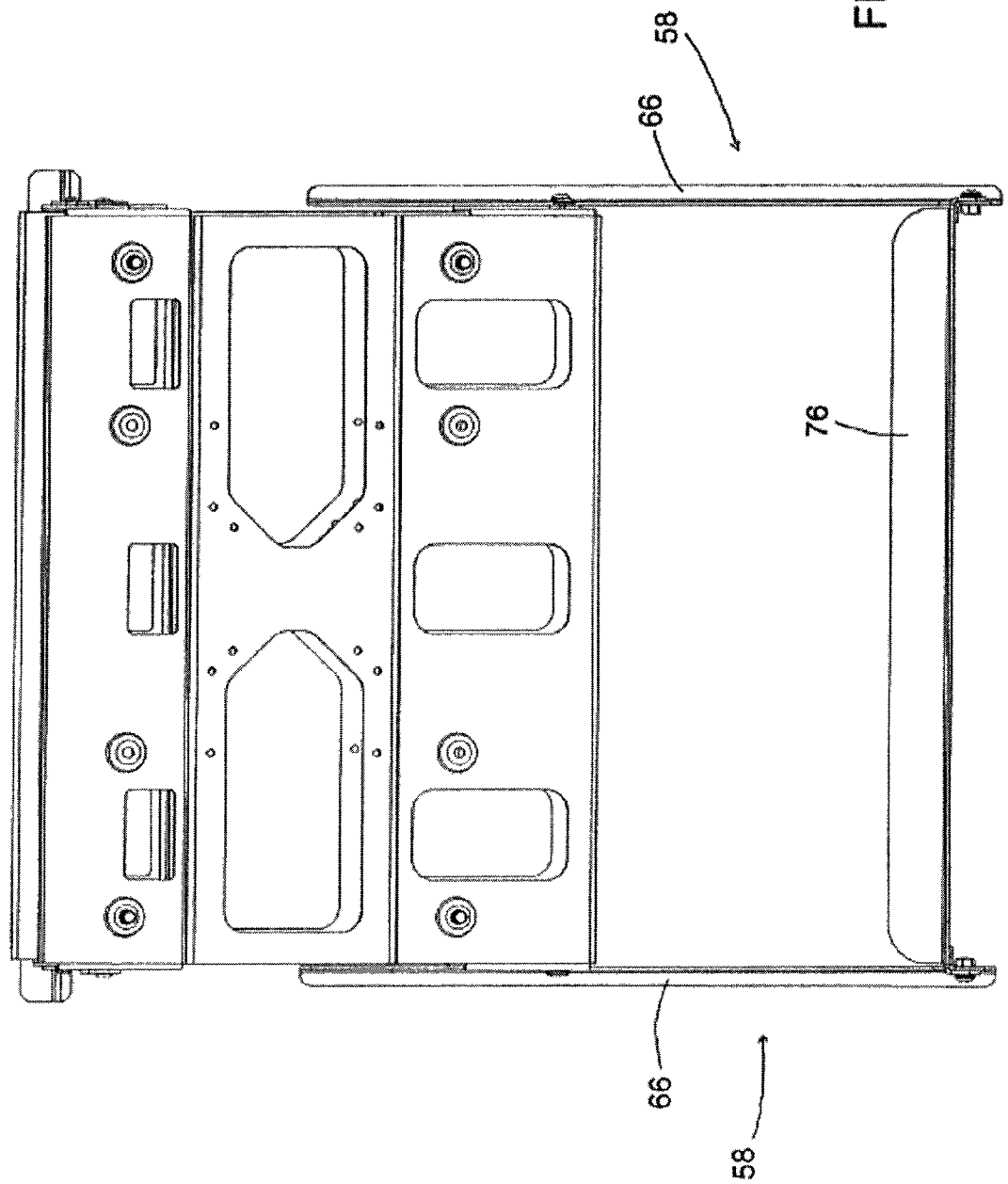
FIG. 8 is a front elevation view of the mounting device which illustrates features of the mounting device and the shelving unit.
Figure 9:
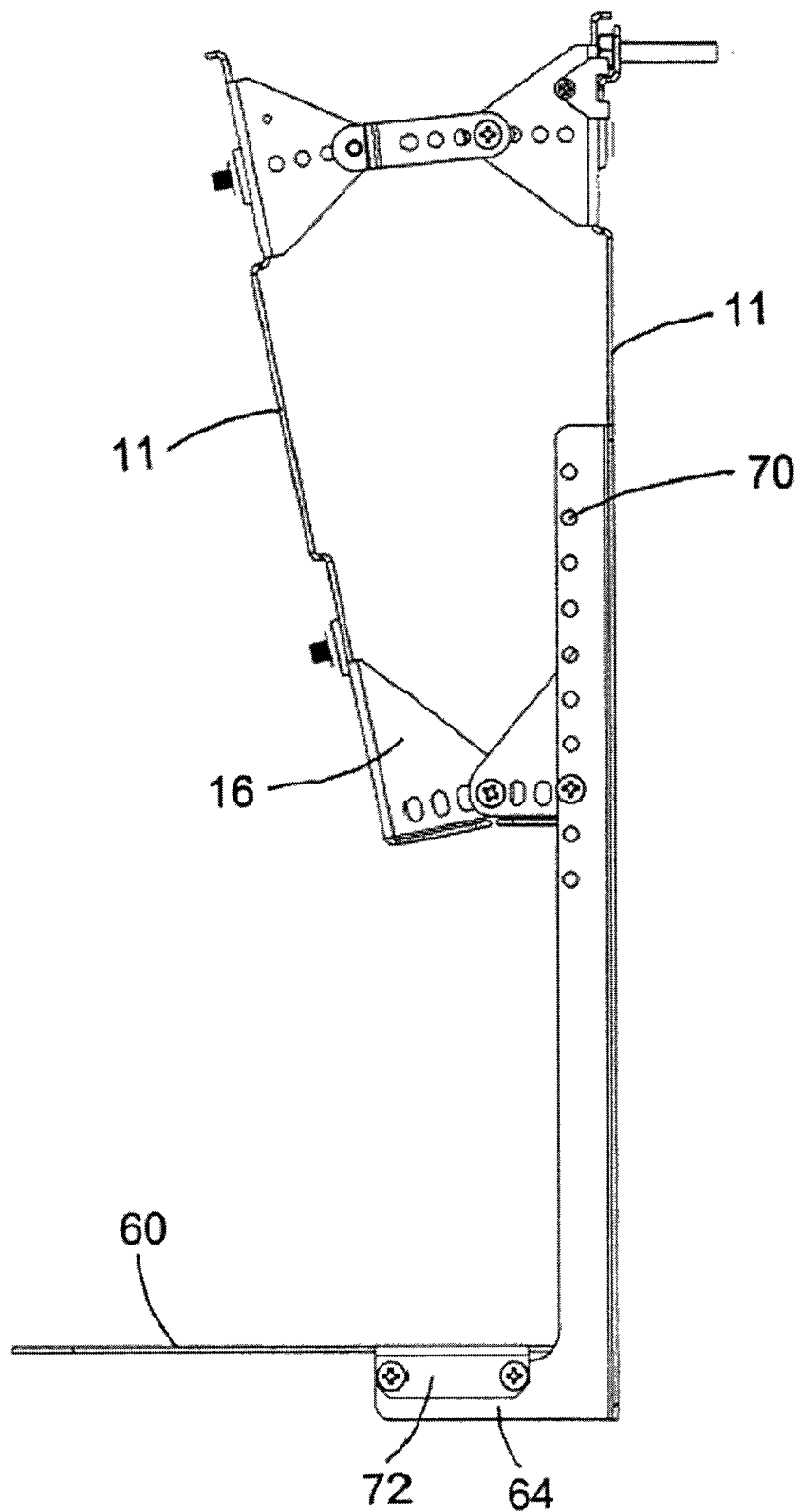
FIG. 9 is a side elevation view of the mounting device which illustrates details of the mounting device and shelving unit.
Figure 16:
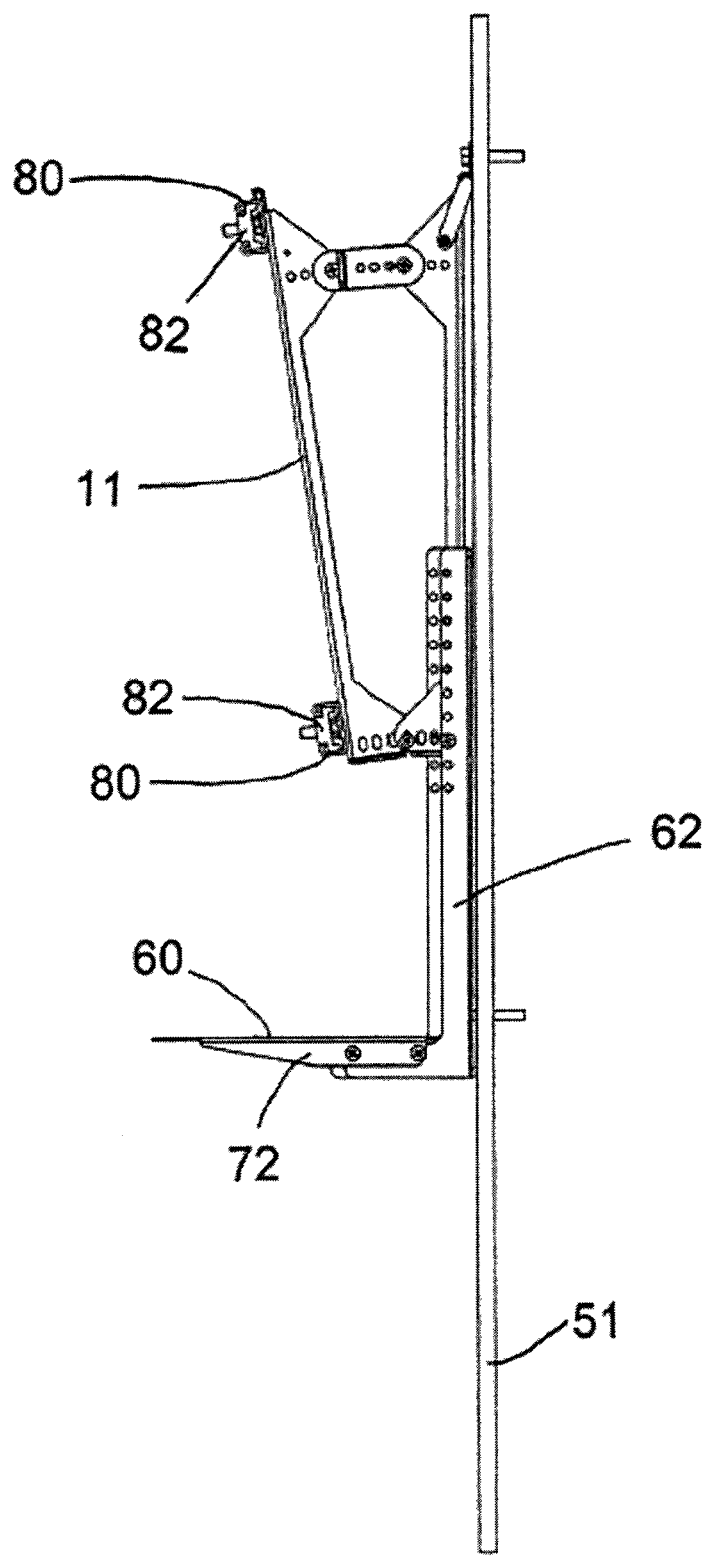
FIG. 16 is a side elevation view of the mounting device which illustrates the features of the shelving unit and universal mounting channels secured to the mounting device which is mounted to a wall.
Figure 17:
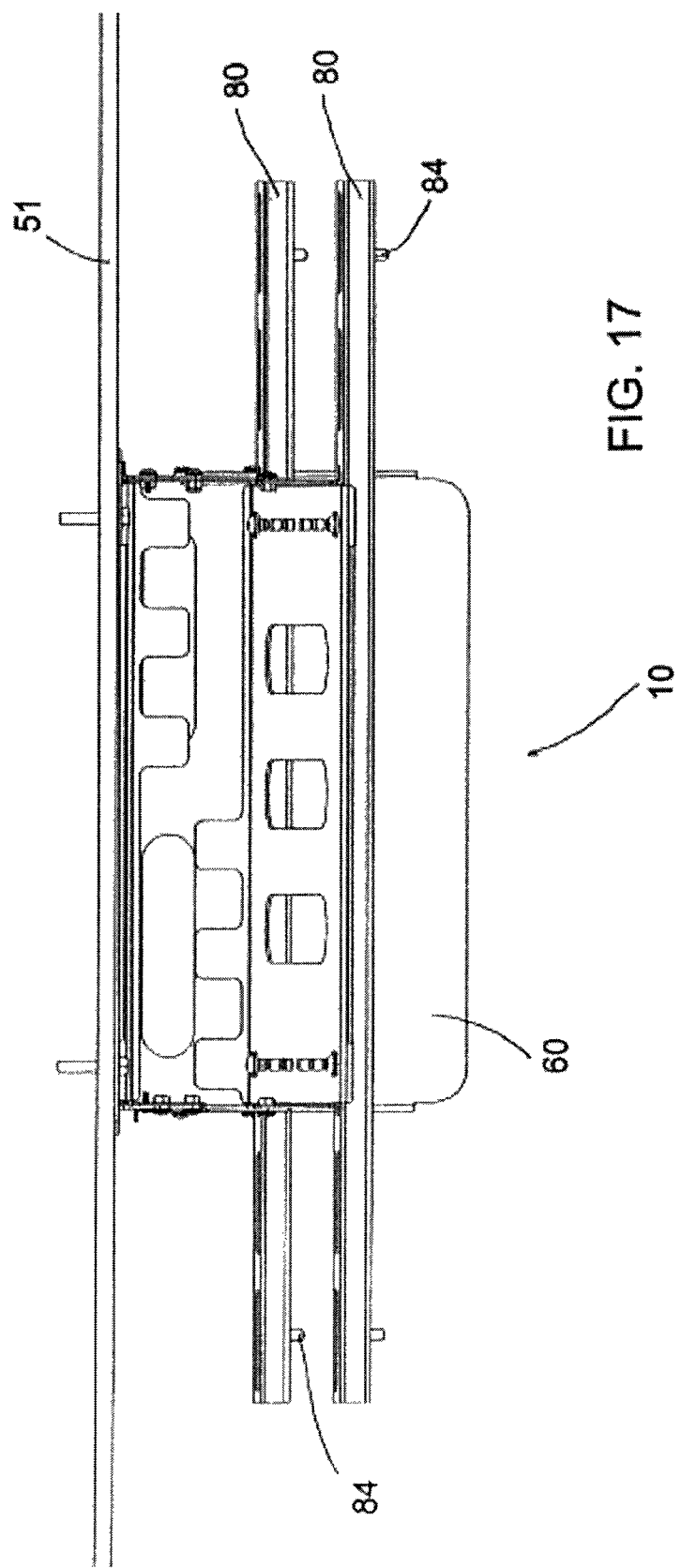
FIG. 17 is a top view of the mounting device which illustrates the features of the shelving unit and universal mounting channels secured to the mounting device which is mounted to a wall.

The shelf 60 has a pair of mounting tabs 72. As best shown in FIGS. 7 and 8, the mounting tabs 72 extend over the arms 64 of the L-shaped brackets 58 and are secured to an outwardly facing surface of the arms 64 by conventional fasteners, e.g., a screw or nut and bolt for example. The arms 64 of the L-shaped brackets 58 may also include support tabs 64 (FIG. 12) which extend under and engage with a bottom surface of the shelf 60 and provide the shelf 60 with additional support. It is to be appreciated that the shelf 60 can be secured to the L-shaped brackets 58 in any number of different ways. For example, the mounting tabs could be secured to the inside surface of the arms 64 by conventional fasteners or the shelf 60 could simply be welded to the arms 64 without the use of mounting tabs. When the shelf 60 is secured to the L-shaped brackets 58, the shelving unit 56 can be utilized for supporting one or more peripheral electronic device(s), component(s) or other accessory to which frequent and easy access may be desired, such as to exchange desired media, i.e., video games or movies.

The shelf 60 further includes one or more openings and a rear plate 76. The one or more openings 74 which enable the passage of a cable jack(s) and some other electrical wire or cable connection(s) through the shelf 60. A rear plate 76 of the shelving unit 56 is provided to enhance a rigidity of the shelf 60 and resist bending thereof. In addition, it is to be appreciated that the shelf 60 can be pivotally attached to the pair of L-shaped brackets 58 in order to facilitate pivoting the shelf 60 from an in-use-position, generally shown in FIG. 7, into a stowed not-in-use-position (not shown), without the departing from the spirit and scope of the present invention.

FIGS. 7 through 12 also illustrate a tab extension 16' for use with the present invention. This tab extension 16' connects mating tabs 16 and facilitates captively retaining the desired peripheral electronic device(s), component(s) or accessory within the interior recess R of the housing 10. In FIGS. 7 through 12, this connecting tab 16 is shown along an upper portion of the embodiment so as to increase a downward tilt of the panel monitor 50 shown therein, even further than the configuration 53 of FIG. 5. Alternatively, this connecting tab 16 may be utilized along the bottom portion so as to increase an upward tilt of the panel monitor 50 (not shown).

Turning now to FIGS. 13 through 17, an intermediate mount for use with the mounting device 2 of the present invention will now be described. In the following description, the previously described elements will be designated with the same reference numerals.

In the previously described embodiment of the mounting device, the flat panel monitor 50 is secured to the front panel 11 of the housing 10 utilizing conventional hardware 12 and possibly four spacers 13. It is also possible to mount the panel monitor 50 to the front panel 11 of the housing 10 via an intermediate mount 78. According to the variation shown in FIGS. 13 through 17, the intermediate mount 78 comprises a separate pair of universal mounting channels 80 and each mounting channel receives a pair of associated mounting nuts 82 and mating fasteners 84, e.g., socket head cap screws. The four mounting nuts 82, two in each mounting channel 80, are rigidly secured to the rear surface of the flat panel monitor 50 by the fasteners 84. The mounting channels 80, as shown in FIGS. 15A and 15B, generally have a C-shaped transverse cross section which captively receives each one of mounting nuts 82 in such a manner that the mounting nuts 82 are retained within the mounting channels 80 but are slidably adjustable therealong.

A rear surface of the mounting channels 80 has a plurality of sequentially arranged elongate horizontal attachment slots 86 provided therein to provide access to facilitate tightening and loosening of the mounting nuts 84 and also facilitate mounting of the mounting channels 80 to the front panel 11 of the housing 10. According to this variation, in order to facilitate connection of the mounting channels 80 to the front surface of the front panel 11 of the housing 10, the front surface of the front panel 11 has a plurality of sequentially arranged elongate vertical attachment slots 88 provided therein. A pair of the plurality of sequentially arranged elongate horizontal attachment slots 86 of the mounting channels 80 engage with, as will be discussed below in further detail, a respective one of the plurality of sequentially arranged elongate vertical attachment slots 88 on the front panel 11 to secure the mounting channels 80 to the housing 10. A respective fastener 90, washers 91 and a mounting nut 92 facilitate attachment of the mounting channels 80 to the front panel 11 of the housing 10. Due to the horizontal and vertical attachment slots 86, 88, the flat panel monitor 50 can readily be adjusted in two dimensions with respect to the front panel 11 of the housing 10 to facilitate an easy and centered attachment thereto.

It should be recognized that because of the adjustability of the mounting nuts 82 within and along the mounting channels 80 as well as the adjustability of the mounting channels 80 with respect to the front panel 11 of the housing 10, via the plurality of sequentially arranged elongate vertical attachment slots 88, the mounting device 2 can readily support monitors of differing formats, shapes and/or sizes. For example, the mounting device 2 can be adjusted to support a square monitor, a monitor that is slightly wider than it is tall (4:3 ratio) or widescreen monitor format that is set at a ratio of 16:9. The mounting device 2 is readily adjustable to support monitors 50 ranging is size from 19 inch diagonals to 80 inch diagonals.

The method of installing the mounting device 2 of FIGS. 13 through 17 is substantially similar to the installation methods of the mounting devices 2 of FIGS. 1 through 12. Since the mounting of the flat panel monitor 50 is similar to that which was previously described, only the differences between this technique of securing the monitor 50 to the mounting device 2 will be discussed in detail.

In order to secure the flat panel monitor 50 to the front panel 11 of the mounting device 2, the pair of mounting channels 80 are each loosely secured to a desired pair of the plurality of sequentially arranged vertical attachment slots 88 on the front panel 11 so as to be parallel to one another at a distance that is at least roughly equivalent to the spacing between desired vertically upper and vertically lower mounting holes located in the back of the flat panel monitor 50. At this point, the mounting channels 80 are only loosely connected to the housing 10, by the conventional fasteners 90, 92 each engaging with a desired pair of the elongate horizontal attachment slots 86 of the mounting channels 80 and the elongate vertical attachment slots 88 on the front panel 11 (see FIG. 15B) thereby permitting further relative adjustment, as required.

Next, with the flat panel monitor 50 lying, screen side facing downward on the floor or some other assembly surface, the partially assembled mounting device 2 is then placed over the rear surface of the flat panel monitor 50 such that a first one of the mounting channels 80 generally overlies the vertically upper mounting holes, while a second one of the mounting channels 80 generally overlies the lower mounting holes in the rear surface of the flat panel monitor 50. Next, each one of the four mounting nuts 82, located within the mounting channels 80, are slid, as necessary, so as to align with a respective desired one of the upper and lower mounting holes in the rear surface of the flat panel monitor 50. Once this is achieved, each one of the respective fasteners 84 are partially tightened.

Once all of the fasteners 82, 84, 90, 92 are partially tightened, the housing 10 and/or the mounting channels 80 are each generally recentered with respect to the rear surface of the flat panel monitor 50. Thereafter, each pair of nuts/fasteners 82, 84 and 90, 92 are securely fastened in a conventional manner. Lastly, the completed assembly can then be affixed to the mounting bracket 18, previously installed to a desired wall or some other structure 51, in the manner described above.

It is to be appreciated that assembly can be performed in the opposite order. That is, the channel members 80 may first be attached to the rear surface of the flat panel monitor 50 and thereafter the channel members 80 can be attached to the front panel 11 of the mounting device 2.

Figure 18:
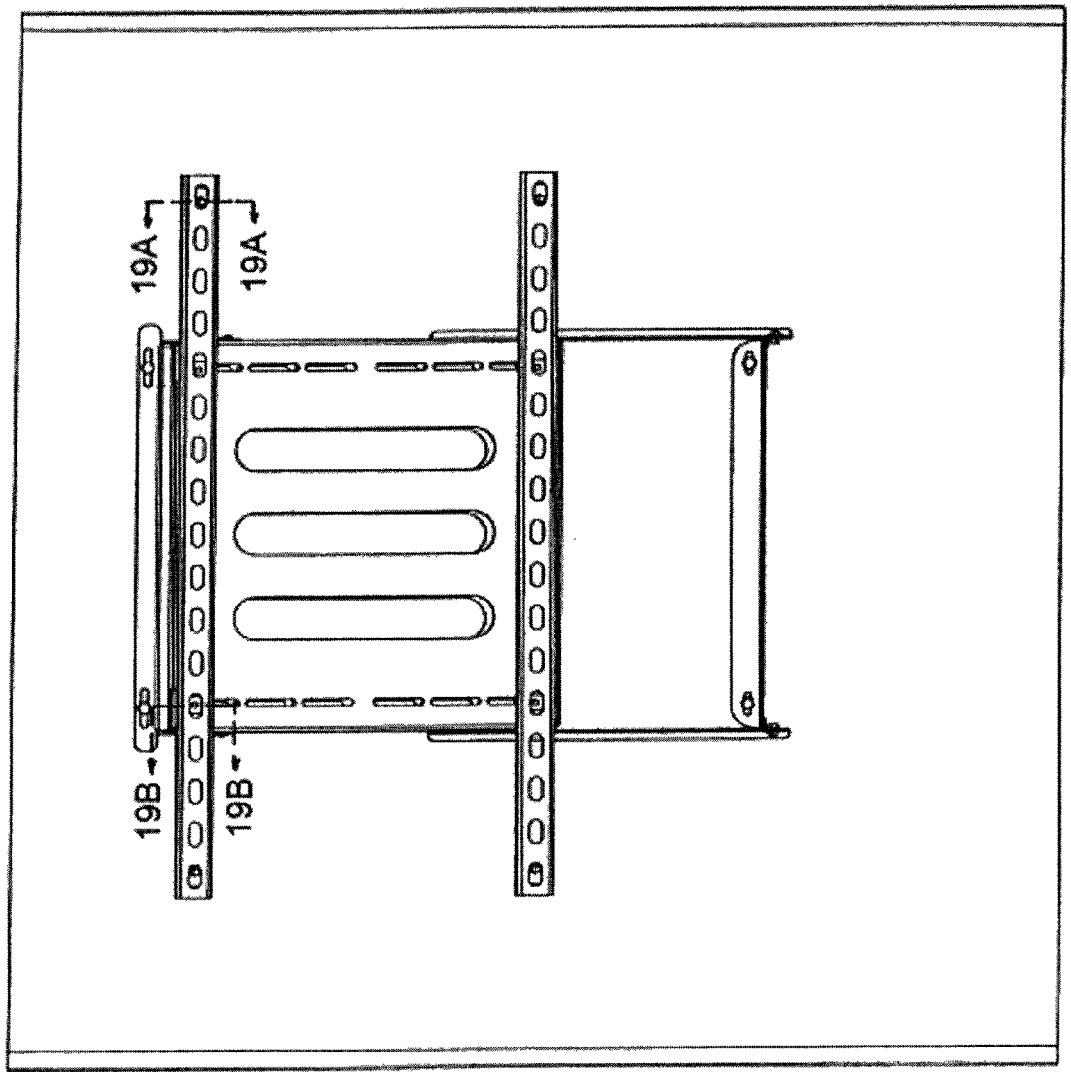
FIG. 18 is a front elevation view of the mounting device illustrated in FIG. 14, with an alternate orientation of the universal mounting channels.
Figure 19A:
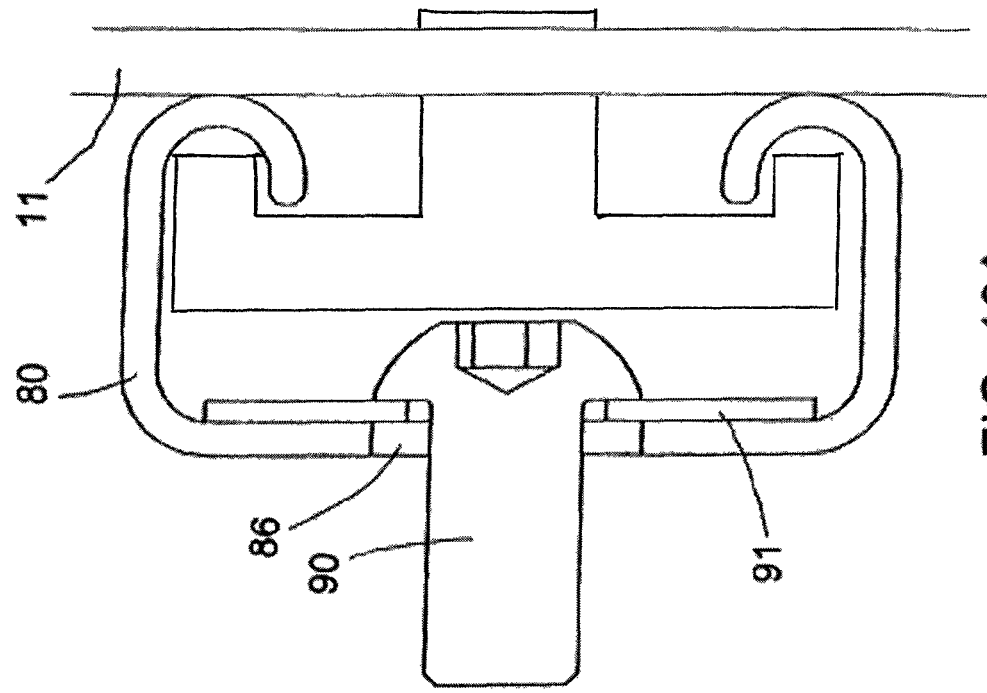
FIG. 19A is a cross sectional diagram of the universal mounting channel viewed along the section line 19A-19A in FIG. 18.
Figure 19B:
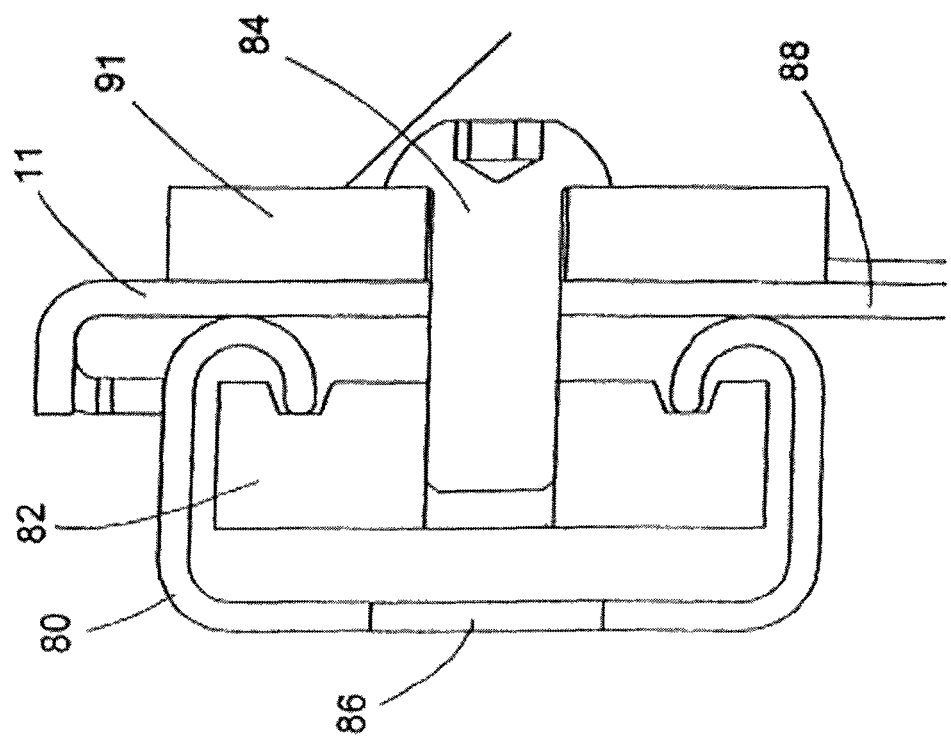
FIG. 19B is a cross sectional view of the universal mounting channel viewed along the section line 19B-19B in FIG. 18.
Figure 20:
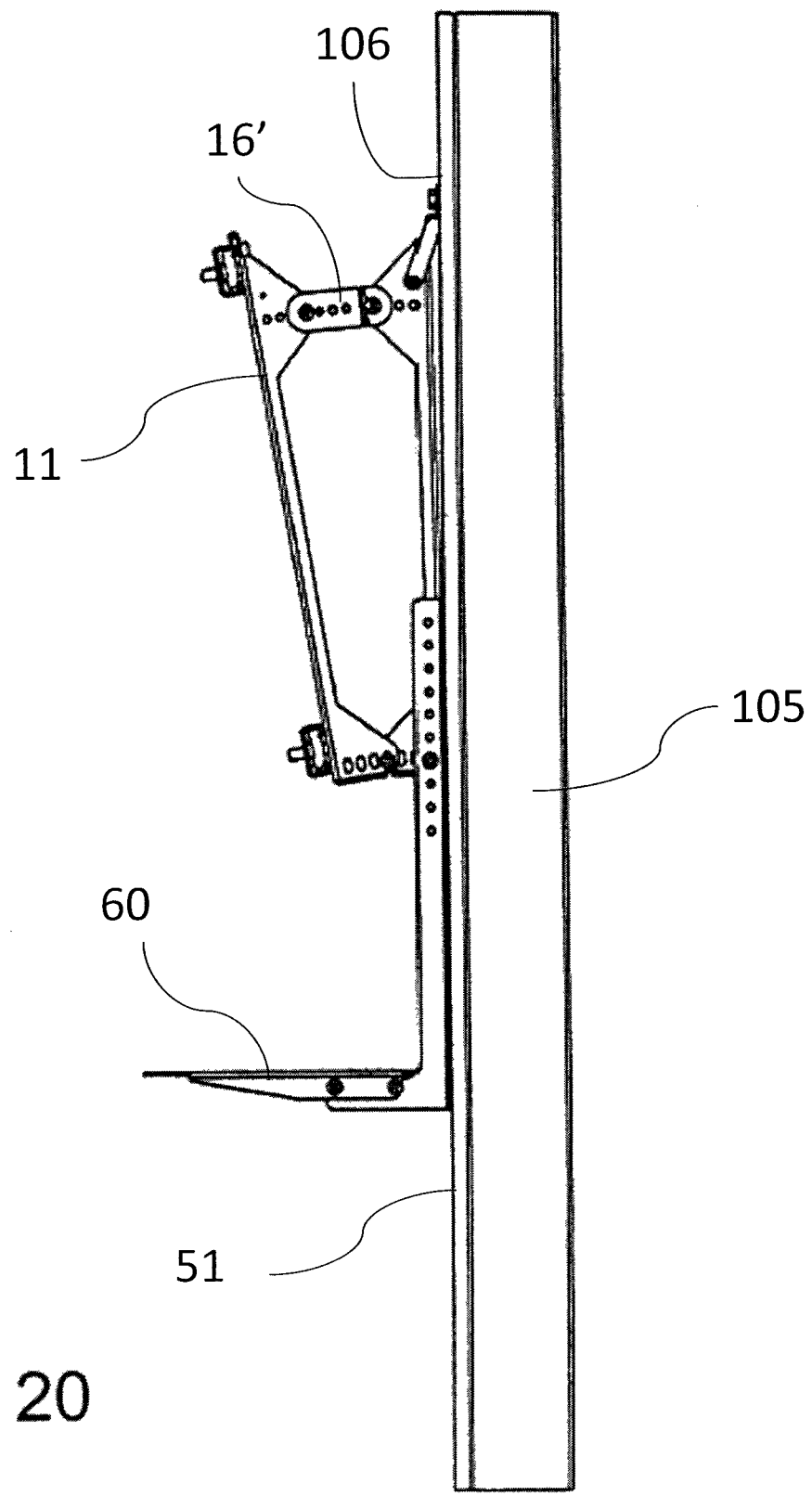
FIG. 20 is a side elevation view of the mounting device illustrated in FIG. 18, which shows the universal mounting channels secured to the mounting device in the alternate orientation.

Shown in FIGS. 18-20 is an alternative embodiment in which the mounting channels 80 are rotated 180 degrees with respect to the front surface of the front panel 11 of the housing 10 such that the rear surface of the C-shaped mounting channels 80 are affixed to the rear surface of the flat panel monitor 50. According to this arrangement, the four mounting nuts 82, two located in each one of the mounting channel 80, are captively received within the mounting channels 80 and rigidly secured to the front panel 11 of the mounting device 2 by the fasteners 84 (FIG. 19B). In addition, the mounting channels 80, are also rigidly secured to the rear surface of the flat panel monitor 50 by the fasteners 90 (FIG. 19A). In all other respects, the mounting device 2 illustrated in FIGS. 18-20 is substantially similar to the mounting device 2 illustrated in FIGS. 13-17 and thus a further detail description concerning the same is not provided.

It is to be appreciated that the overall length of the mounting channels 80 can vary, depending upon the particular application. For example, a long set of the mounting channels 80 can be utilized for the flat panel monitors 50 that have mounting dimensions greater than 400 mm×400 mm and up to 800 mm×400 mm. Alternatively, a short set of mounting channels 80 can be utilized for the flat panel monitors 50 that have mounting dimensions less than 400 mm×400 mm.

Turning now to FIGS. 21-28, a further embodiment of the present invention will now be described in detail. In the following description, those elements which have been previously described will be designated with identical reference numerals.

As with the previous embodiments, the mounting device 2 generally comprises a rigid housing 10 formed by a mating pair of front and rear panels 11. Each panel 11 contains one or more support and retaining features 21 which are generally formed integral with and extend normal from a bottom edge of at least one of the front and rear panels 11. The support and retaining features 21, when the front and the rear panels 11 are mated together with one another, form a bottom side or a base of the housing 10. In addition, each one of the front and the rear panels 11 contains two pair of spaced apart interconnection tabs 16 which are formed integral with and extend normal from side edges of the front and the rear panels 11. Alternatively, the interconnection tabs 16 may be secured to the side edges of the front and the rear panels 11 by conventional fasteners, or by the tab extensions 16' illustrated in FIGS. 7-20.

Figure 22:
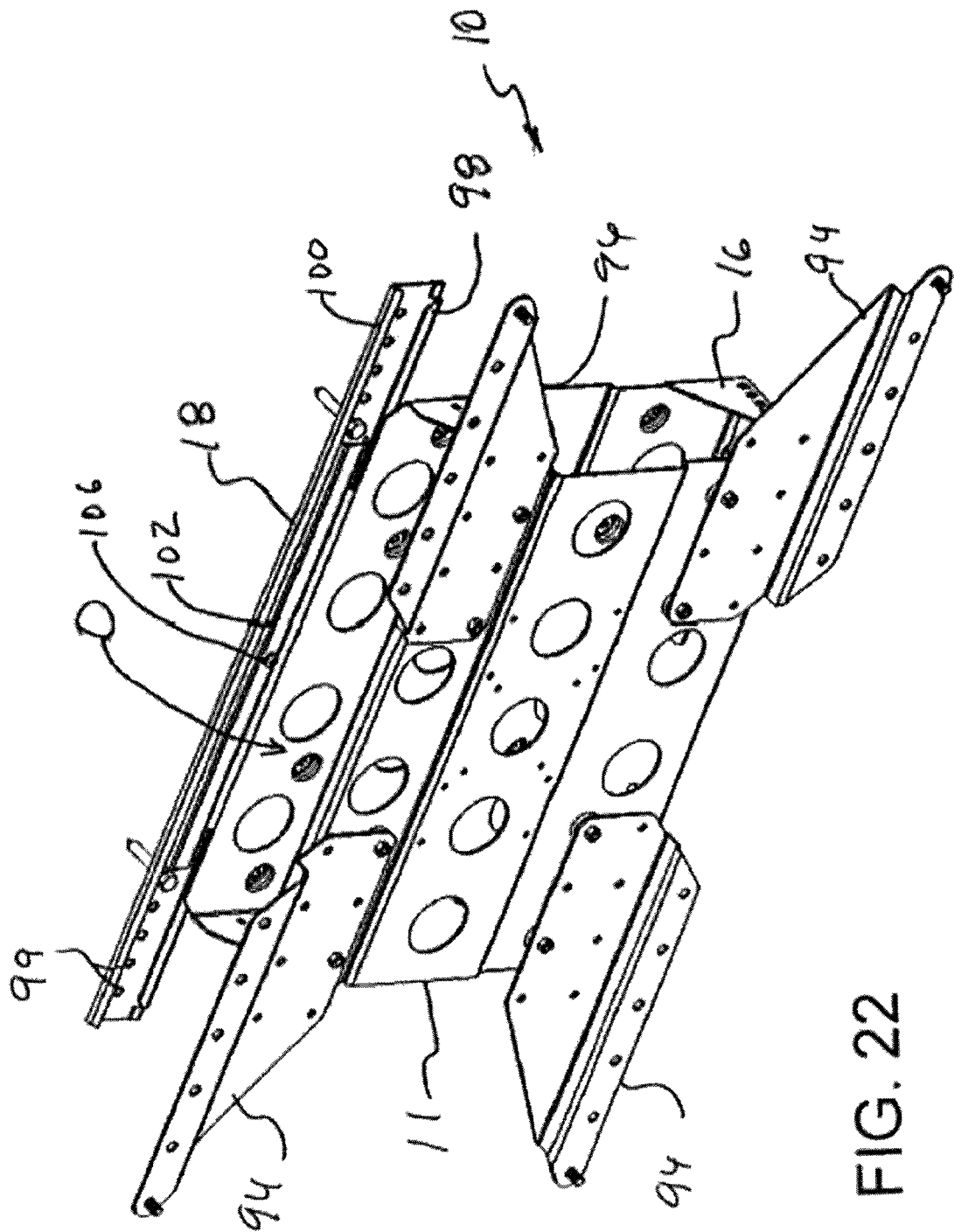
FIG. 22 is an assembled view of the embodiment of FIG. 21.

Once the front and the rear panels 11 are assembled together with one another so that two pairs of interconnection tabs 16 of the front panel 11 engage and overlap with the two pairs of interconnection tabs 16 of the rear panel 11, conventional hardware 17 can pass through the aligned openings of the interconnection tabs 16 and secure the front and the rear panels 11 together with one another, as shown in FIG. 22, and thereby form the rigid housing 10 which defines an interior recess R.

As with previous embodiments, the interior recess R of the housing 10 is sized and shaped so as to accommodate a desired peripheral electronic device(s), component(s) or accessory therein. The support and retaining features 21 and the mating interconnection tabs 16 assist with captively retaining the desired peripheral electronic device(s), component(s) or accessory within the interior recess R of the housing 10. However, an access opening O, formed in the top surface of the housing 10, is generally completely unobstructed so as to facilitate insertion and/or removal of a desired peripheral electronic device(s), component(s) or accessory from the interior recess R of the housing 10.

According to this embodiment, four separate adjustable TV mounts 94 are secured adjacent a respective corner of the front panel 11 of the housing 10 via a plurality of conventional fasteners, e.g., two pair of nuts, bolts, spacers, etc. As shown, each one of the four separate adjustable TV mounts 94 has a plurality, e.g., eight holes or apertures, a pair of which is generally utilized for securing each one of the adjustable TV mounts 94 to the front panel 11 of the housing 10 via a plurality of conventional fasteners. Also as shown, each one of the four separate adjustable TV mounts 94 has a plurality, e.g., six aligned holes or apertures, for securing each one of the adjustable TV mounts 94 to the rear surface of the desired flat panel monitor 50.

Figure 24:
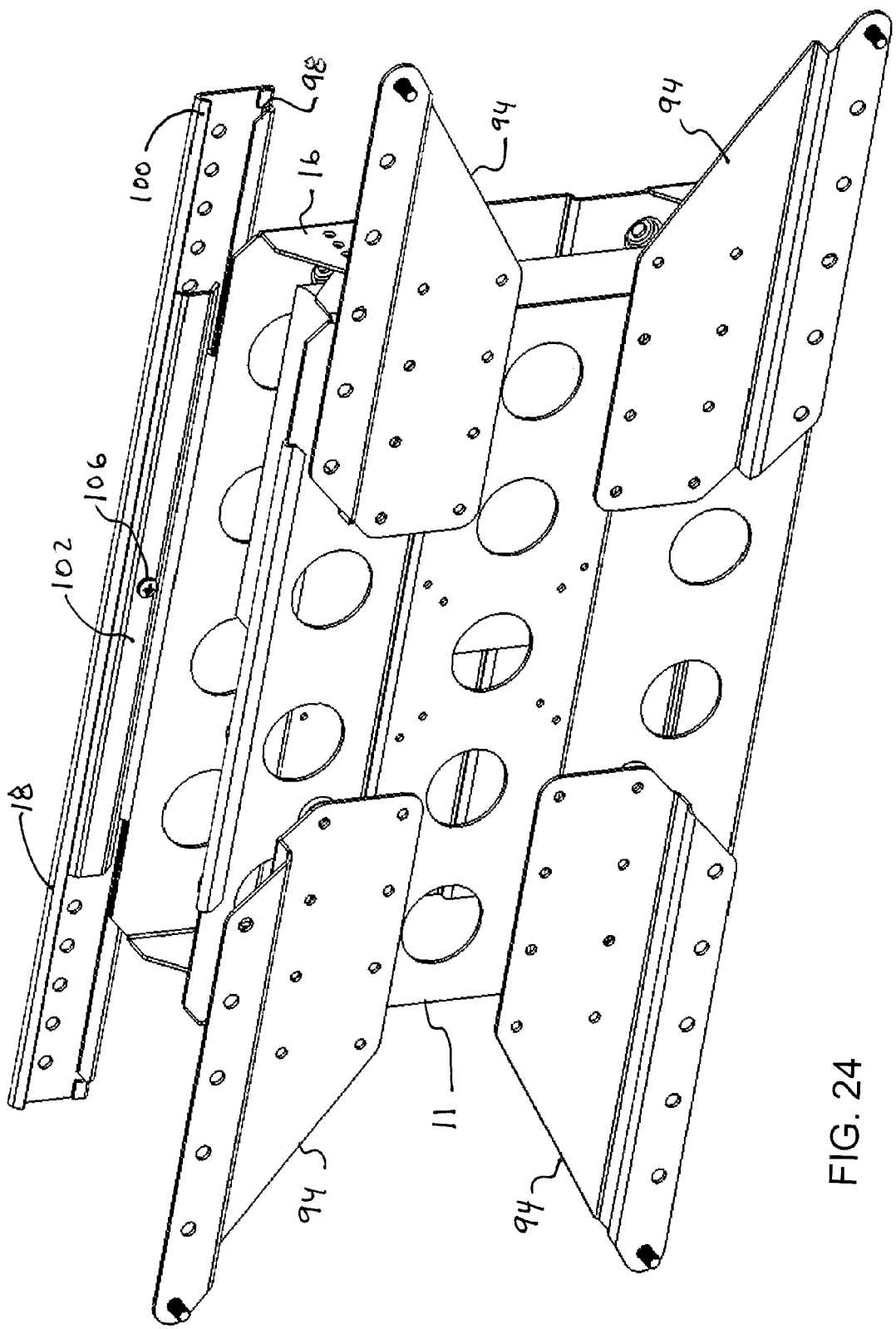
FIG. 24 shows the four adjustable TV mounts installed closer to a center of the front panel to facilitate mounting a medium sized flat panel monitor.

It is to be appreciated that the mounting location, for each one of the four adjustable TV mounts 94, is variable by using different combinations of the eight holes or apertures with the desired holes or apertures provided in the front panel 11 so that a variety of different size flat panel monitors 50 can be easily and reliably secured to the mounting device 2 via the four adjustable TV mounts 94. For mounting a "medium sized" flat panel monitor 50 (as shown in FIG. 24), the four adjustable TV mounts 94 are connected to the front panel 11 closer to a central region thereof. For mounting a "larger sized" flat panel monitor 50 (as shown in FIG. 22), the four adjustable TV mounts 94 are correspondingly installed further away from the central region of the front panel 16.

Figure 25:
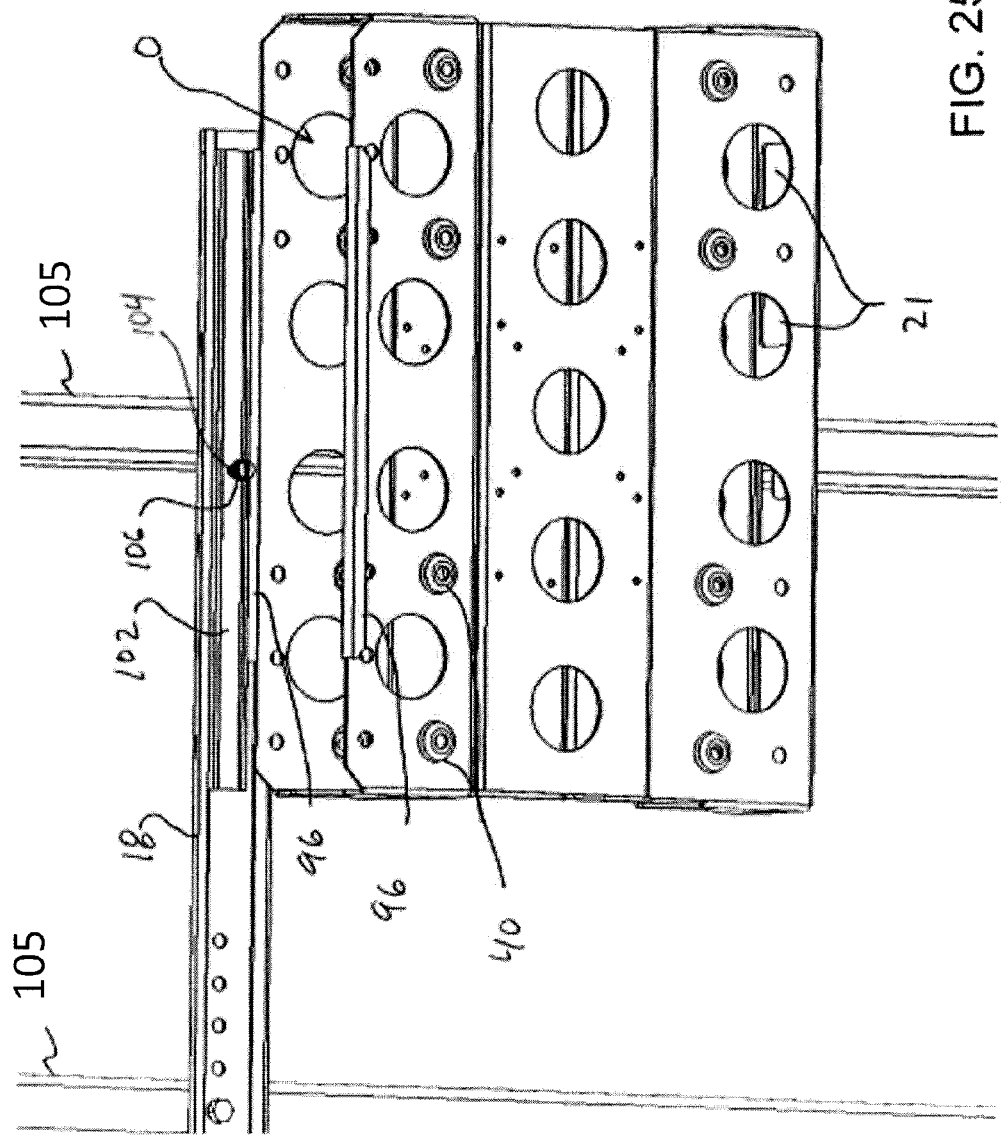
FIG. 25 is a front perspective view showing adjustment of the mounting device, without any adjustable TV mount secured thereto, located about 8 inches toward the right relative to a central position of the mounting bracket.
Figure 26:
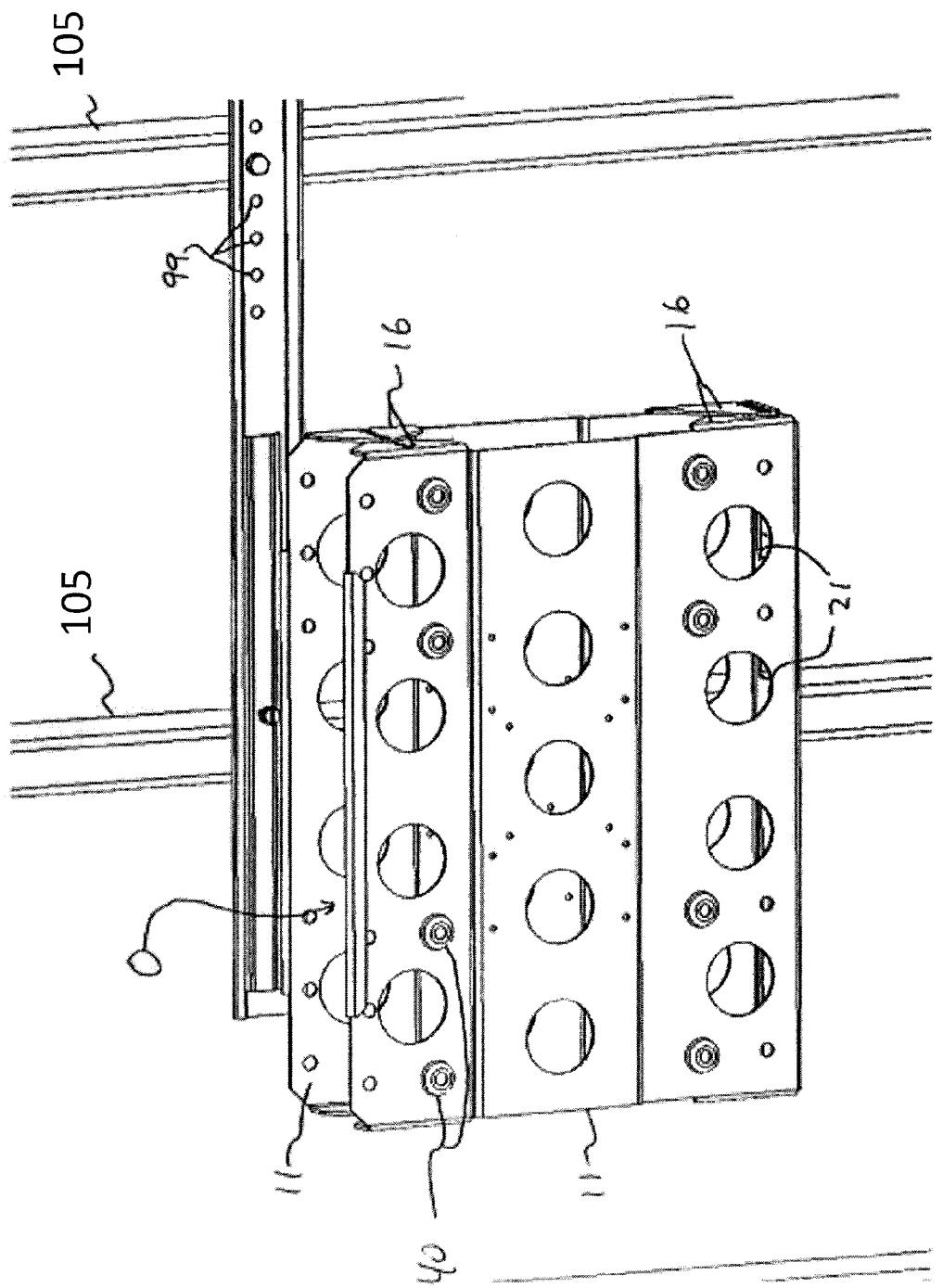
FIG. 26 is a front perspective view showing adjustment of the mounting device, without any adjustable TV mount secured thereto, located about 8 inches toward the left relative to a central position of the mounting bracket.
Figure 27:
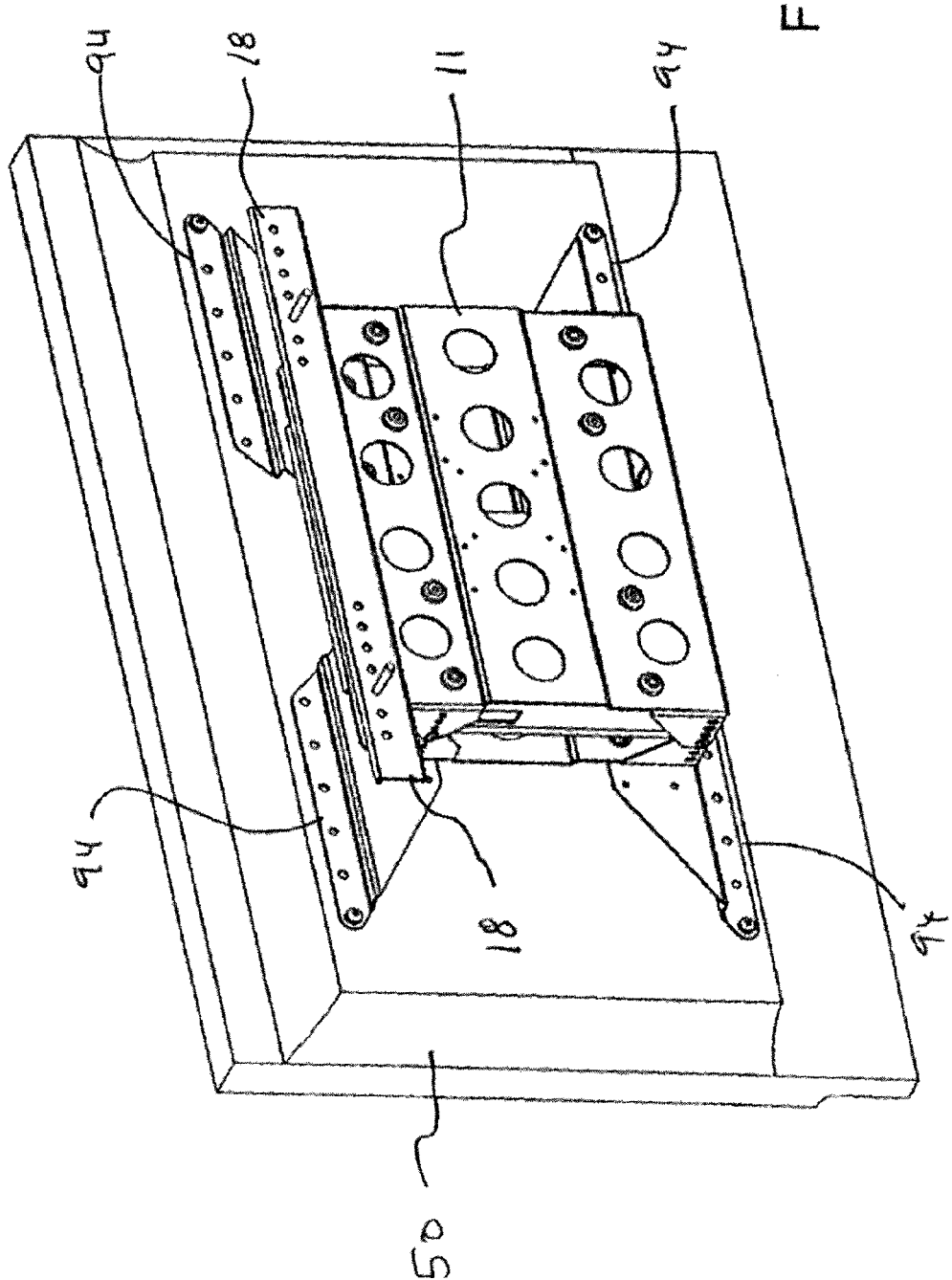
FIG. 27 is a diagrammatic top, rear, left side perspective view showing the mounting device mounted to a flat panel TV and attached to the mounting bracket with a cable TV accommodated within the interior recess of the housing.

Generally then, for mounting a smaller flat panel monitor, with a VESA standard of 75×75, 100×100, 200×100, 200× 200, 400×200, none of the four adjustable TV mounts 94, as shown in FIGS. 25, 26, are necessary for such installation. For mounting a medium sized flat panel monitor, e.g., a VESA standard of 200 mm×300 mm, 300 mm×300 mm, 400 mm×300 mm, 500 mm×300 mm, 600 mm×300 mm, 700 mm×300 mm, 800 mm×300 mm, the four adjustable TV mounts 94 are generally installed in the position illustrated in FIG. 24. Then, for mounting a larger sized TV, with a VESA standard of 200 mm×400 mm, 300 mm×400 mm, 400 mm×400 mm, 500 mm×400 mm, 600 mm×400 mm, 700 mm×400 mm, 800 mm×400 mm, the four adjustable TV mounts 94 may be installed generally in the position illustrated in FIG. 22.

Figure 21:
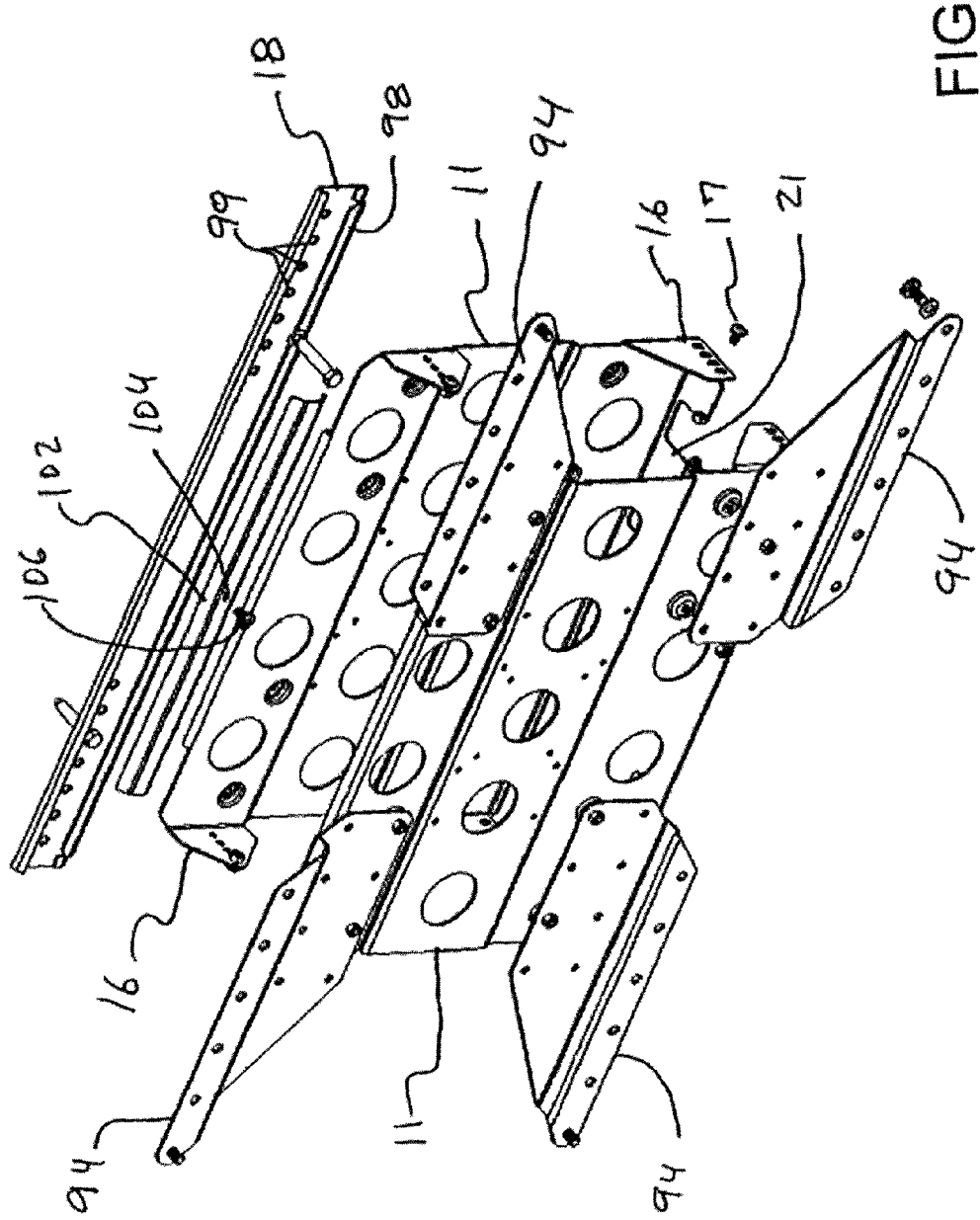
FIG. 21 is an exploded front view of still another embodiment of the present invention prior to attachment of the four adjustable TV mounts thereto.

As shown in FIG. 21, a first pair of conventional fasteners, e.g., nuts, bolts and spacers, secure each one of the four adjustable TV mounts 94 to the front panel 11 of the housing 10. In addition, as diagrammatically shown in the drawing, a second conventional fastener, e.g., screws and washers, secures the desired flat panel monitor 50 to each respective one of the four adjustable TV mounts 94. That is, generally four conventional fasteners are utilized to secure the flat panel monitor 50 to the mounting device 2, as generally described above.

Figure 23:
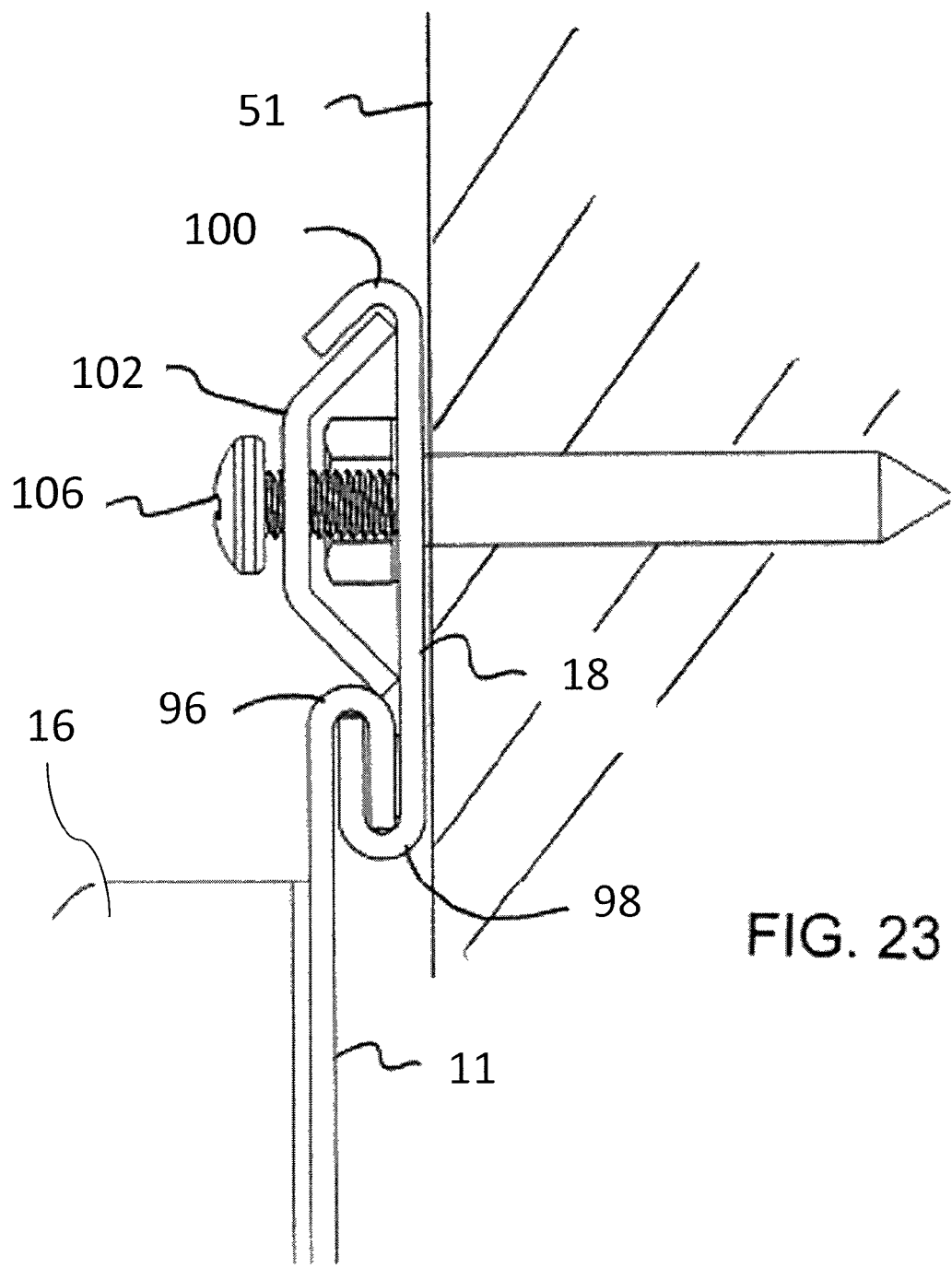
FIG. 23 is a diagrammatic cross-sectional view along section line 23-23 of FIG. 22.
Figure 28:
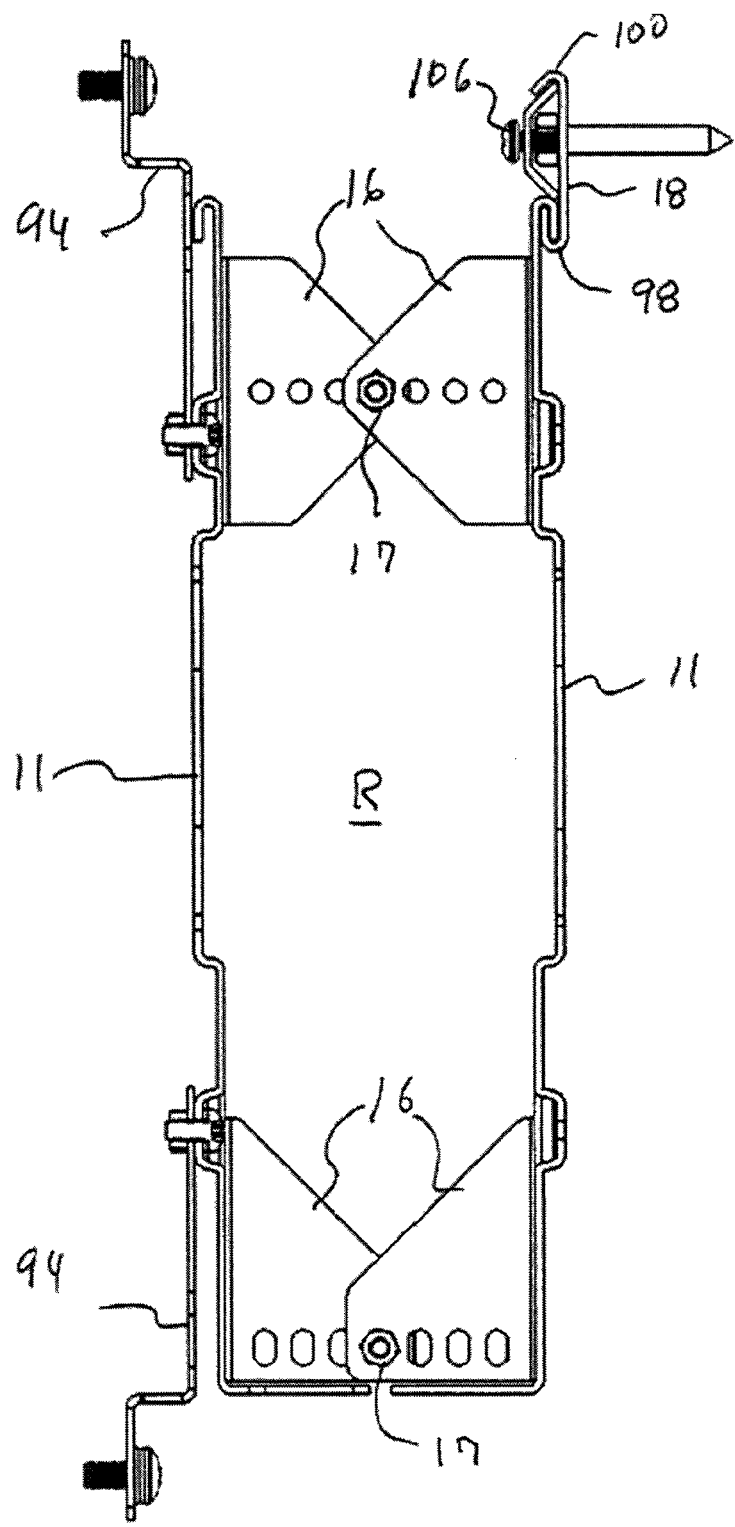
FIG. 28 is a diagrammatic side elevational view of assembled embodiment of FIG. 22.

As best shown in FIGS. 23 and 28, a topmost longitudinal edge of each one of the front and the rear panels 11 is folded or bent over to form a substantially C-shaped panel hook 96 which facilitates hanging of the mounting device 2 from a desired mounting bracket 18, as described below in further detail. The C-shaped panel hook 96 extends substantially along the entire length of at least the rear panel 11. The C-shaped panel hook 96 defines an interior cavity which is sized and shaped so as to intimately receive and engage with a mating C-shaped bracket hook 98 of the mounting bracket 18, described below in further detail.

As briefly discussed above, a mounting bracket 18 is utilized for hanging or supporting the mounting device 2, as well as the attached flat panel monitor 50, from a desired wall or some other support surface or structure 51. As generally shown in FIG. 21 for example, the mounting bracket 18 has a length of 26 inches (for a shorter bracket) and 31 inches (for a longer bracket) and has a width of about 2 inches. A plurality of spaced apart mounting apertures 99 are formed in the mounting bracket 18 adjacent and at least along each opposed end thereof for securing the mounting bracket 18 to the desired wall or some other support surface or structure 51. That is, as generally shown, seven (7) spaced apart mounting apertures 99 are located adjacent a first end of the mounting bracket 18 while an additional seven space apart mounting apertures 99 are formed adjacent the opposite second end of the mounting bracket 18.

Each mounting aperture 99, located adjacent the first end the mounting bracket 18, is preferably spaced 16 inches away from a corresponding mounting aperture 99 located adjacent the second end of the mounting bracket 18. This spacing facilitates mounting of the mounting bracket 18 to studs 105 of a desired wall or some other support surface or structure 51 which typically has stud-to-stud spacing of 16 inches-on-center. Each mounting aperture 99 is sized to receive a conventional fastener for securing the mounting bracket 18 to the desired wall or some other support surface or structure 51, e.g., via a pair of conventional fasteners, e.g., screws, lag bolts, etc.

As shown in FIGS. 21 and 23, a longitudinal bottom edge of the mounting bracket 18 curves inwardly and forms the mating C-shaped bracket hook 98 which is sized and shaped to matingly receive and engage with the C-shaped panel hook 96 of the mounting device 2. That is, the C-shaped bracket hook 98 of the mounting bracket 18 defines an interior cavity which is sized and shaped to intimately receive and engage with the mating C-shaped panel hook 96 of the mounting device 2 and facilitate secure retention thereof. The C-shaped bracket hook 98 extends lengthwise substantially along the entire longitudinal bottom edge of the mounting bracket 18.

In addition, a longitudinal top edge of the mounting bracket 18 is bent inwardly, toward the C-shaped bracket hook 98 and the bent top longitudinal edge 100 of the mounting bracket 18 extends substantially along the entire top longitudinal edge of the mounting bracket 18. Together, the C-shaped bracket hook 98, the bent top longitudinal edge 100 of the mounting bracket and a locking member 102 (which will be described in further detail below) form a retaining feature which facilitates secure, but releasable retention of the mounting device 2 with the mounting bracket 18.

The locking member 102 of this retaining feature is utilized in order to prevent inadvertent separation of the mounting device 2 from the mounting bracket 18, e.g., in the event that the attached flat panel monitor 50 is inadvertently bumped by a person or otherwise moved so that the mounting device 2 is prevented from becoming inadvertently separated from the mounting bracket 18. The locking member 102 has a longitudinal length of about 15+9 inches, typically about 15 inches, and has a width of about 1 11/32 inches. The locking member 102 is generally a planar component but both longitudinal side edges are bent partially toward one another so that the locking member 102 has a slightly curved or U-shaped profile, as shown in FIGS. 21, 23 and 28. As a result of this, when the locking member 102 is installed, the locking member 102 is generally captively retained between the bent longitudinal top edge 100 of the mounting bracket 18 and the C-shaped panel hook 96 of the mounting device 2, as shown in FIGS. 23 and 28. This arrangement prevents inadvertent vertical movement of the mounting device 2 relative to the mounting bracket 18, and thus prevents inadvertent separation or accidental decoupling of the C-shaped panel hook 96 from the C-shaped bracket hook 98.

A centrally located threaded hole 104 is formed in the locking member 102 and a threaded fastener 106 threadedly engages with this threaded hole 104 to secure the locking member 102 at a desired location along the mounting bracket 18, as shown in FIG. 25. The threaded fastener 106 prevents any lateral movement of the locking member 102, and thus the mounting device 2, along the length of the mounting bracket 18.

During installation, the mounting bracket 18 is typically first mounted to a desired wall or some other support surface or structure 51 by a pair of conventional fasteners. Next, the flat panel monitor 50 to be mounted is typically placed, screen side facing downward, on a floor or some other assembly surface and the four adjustable TV mounts 94 as secured to the front panel 11 at the desired installation locations, depending upon the size of the flat panel monitor 50 to be mounted. The four adjustable TV mounts 94 are then attached to the rear surface of the flat panel monitor 50 utilizing a desired one of the set of mounting holes 40 of the front panel and a desired one of the set of mounting holes of each of the four adjustable TV mounts 94, depending upon the size of the flat panel monitor 50 to be mounted. The rear panel 11 is then attached to the front panel 11 by connecting the two pairs of tabs 16 to one another via suitable fasteners, Next, the flat panel monitor 50, along with the attached front and rear panels 11, are all lifted and the C-shaped panel hook 96 of the mounting device 2 is engaged with the C-shaped bracket hook 98 of the mounting device 2 to mount the flat panel monitor 50 to the desired wall or some other support surface or structure 51.

The locking member 102 is then inserted into one of the opposed ends of the mounting bracket 18 and slid therealong to a desired central location. Once the threaded fastener 106 is sufficiently tightened, the locking member 102 engages with both the C-shaped panel hook 96 and the bent longitudinal top edge 100 of the mounting bracket and generally biases the C-shaped panel hook 96 into constant and continuous engagement with the C-shaped bracket hook 98. Thus, the locking member 102 prevents inadvertent separation or disengagement of those two components with one another. The threaded fastener 106 of the locking member 102, once sufficiently tightened, prevents inadvertent sliding or other unintentional lateral movement of the locking member 102 with respect to the mounting bracket 18.

Lastly, the desired peripheral electronic device(s), component(s) or accessory to be accommodated by the mounting device 2 is then placed through the access opening O, received within the internal recess R, and supported by the retaining features 21. The cable input and electrical power are then both connected to the flat panel monitor 50 in conventional manners.

It is to be appreciated that while the mounting device 2 is generally designed to be centrally located and supported by the mounting bracket 18, the mounting device 2 can be located and supported by any portion of the mounting bracket 18. That is, the mounting bracket 18 is first installed at a desired location along a wall or some other support surface where the flat panel monitor 50 is to be mounted, e.g., by inserting a conventional fastener through a mounting aperture 99 located adjacent each opposed end of the mounting bracket 18 and into a respective stud 105 located behind the wall or surface where the flat panel monitor 50 is to be mounted. Next, the C-shaped panel hook 96 of the mounting device 2 is engaged with the C-shaped bracket hook 98 of the mounting device 2 to mount the flat panel monitor 50 to the desired wall or some other support surface or structure 51. The flat panel monitor 50 is then moved, e.g., slid right (see FIG. 25) or left (see FIG. 26) along the mounting bracket 18, into its desired location. Once the flat panel monitor 50 is then laterally positioned in the desired location, the locking member 102 is then utilized to secure the flat panel monitor 50 in that position. This arrangement provides at least +8 inches of lateral adjustment for the flat panel monitor 50, in either direction such as the left as shown in FIG. 25 or to the right as shown in FIG. 26, so that the mounting bracket can be securely supported by stud 105, for example, while the flat panel monitor 50 can be position at precisely its desired location along the wall.

In the above description and appended drawings, it is to be appreciated that only the terms "consisting of" and "consisting only of" are to be construed in the limitative sense while of all other terms are to be construed as being open-ended and given the broadest possible meaning.

Since certain changes may be made in the above described improved mounting device for a flat panel monitor, without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, we claim:

1. A mounting device, for a flat panel monitor, comprising:
a front panel and a mating rear panel;
the front panel and the rear panel being adjustably connectable with one another by at least two side tabs;
at least one retaining feature extending from a lower portion of at least one of the front and the rear panels toward another of the front and the rear panels to form a base for supporting at least one peripheral electronic device thereon, and the front panel, the rear panel, the at least one retaining feature and the at least two side tabs together forming a housing which defines an internal recess;
at least the front panel having a plurality of mounting apertures therein for securing the housing to a desired flat panel monitor;
a mounting bracket for attachment to a desired surface by at least one fastener;
the rear panel of the housing having a hook which facilitates attachment of the housing to a mounting bracket desired support surface;
a removable locking member, being received by the mounting bracket, for preventing the housing from becoming inadvertently separated from the mounting bracket; and
the housing being open on a top side thereof to facilitate insertion and removal of at least one peripheral electronic device therefrom and being at least partially closed, on a remaining five sides thereof, so as to facilitate retaining the at least one peripheral electronic device within the housing, and the internal recess being sized for accommodating the at least one peripheral electronic device therein, on the at least one retaining feature, between the desired flat panel monitor and the desired surface,
wherein the top side of the housing is completely unobstructed so as to facilitate unhindered access to the internal recess and at least one peripheral electronic device to be located within the housing.

2. The mounting device according to claim 1, wherein the at least one peripheral device is one of a HD box, a video network reception box, a cable TV satellite box, a video game device, a video game console, a DVD player, a cable TV box, a Blu-ray player and a Wired or Wireless Internet Reception Device.

3. The mounting device according to claim 1, wherein the housing has a plurality of ventilation openings therein which facilitate ventilation of the at least one peripheral electronic device.

4. The mounting device according to claim 1, wherein the front and the rear panels releasably engage with one another to form the housing and facilitate adjustment of a desired spacing between the front panel and the rear panel of the mounting device from one another and accommodate the at least one peripheral electronic device therebetween in the internal recess.

5. The mounting device according to claim 1, wherein the front and the rear panels releasably engage with one another to form the housing and facilitate adjustment of a desired spacing between the front panel and the rear panel of the mounting device from one another and provide a tilt of the front panel relative to the rear panel.

6. The mounting device according to claim 1, wherein a top most longitudinal edge of at least one of the front panel and the rear panel is bent over to form the hook which is substantially a C-shaped panel hook that facilitates hanging of the mounting device from the mounting bracket, and the C-shaped panel hook defines an interior cavity which is sized and shaped so as to intimately receive and engage with a mating edge of the mounting bracket.

7. The mounting device according to claim 6, wherein a longitudinal bottom edge of the mounting bracket curves inwardly and forms a mating C-shaped bracket hook which is sized and shaped to matingly receive and engage with the C-shaped panel hook of the mounting device.

8. The mounting device according to claim 6, wherein a longitudinal top edge of the mounting bracket is bent inwardly, toward the C-shaped bracket hook and the bent longitudinal top edge extends substantially along an entire top longitudinal edge of the mounting bracket, and the C-shaped bracket hook and the bent longitudinal top edge together, in combination with the locking member, form a retaining feature which facilitates secure, but releasable retention of the mounting device in engagement with the mounting bracket.

9. The mounting device according to claim 8, wherein the C-shaped bracket hook of the mounting bracket defines an interior cavity which is sized and shaped to intimately receive and engage with the C-shaped panel hook of the mounting device and facilitate secure retention thereof, and the C-shaped bracket hook extends substantially along an entire longitudinal bottom edge of the mounting bracket.

10. The mounting device according to claim 8, wherein the locking member is generally planar but both opposed longitudinal side edges are bent partially toward one another so that the locking member has a slight U-shaped profile which, when the locking member is installed, the locking member is captively retained between the bent longitudinal top edge and the C-shaped panel hook.

11. The mounting device according to claim 10, wherein the locking member has a length in a range of about 15 to 24 inches and a width of about 1 and 11/32 inches.

12. The mounting device according to claim 10, wherein the locking member has a threaded hole and a threaded fastener threadedly engages with the threaded hole for securing the locking member at a desired location along the mounting bracket.

13. The mounting device according to claim 1, wherein the mounting bracket has a length of between 26 and 31 inches and a width of about 2 inches, and the mounting bracket has a plurality of spaced apart mounting apertures formed therein, adjacent each opposed end thereof, for securing the mounting bracket to the desired surface.

14. The mounting device according to claim 1, wherein a shelving unit is supported by the rear panel and forms a shelf for supporting at least one additional peripheral electronic device thereon and the shelf facilitates access to the at least one additional peripheral electronic device.

15. The mounting device according to claim 14, wherein the shelving unit comprises at least two L-shaped brackets, each having an elongate body, a top end of the elongate body releasably engages a respective lateral side of the rear panel, an opposite bottom end of the elongate body comprises an arm that extends normal to the elongate body, a planar shelf plate extends laterally from one of the L-shaped brackets to an other of the L-shaped brackets and is fixed to the arms of the L-shaped brackets to form the shelf which supports the at least one additional peripheral electronic device thereon.

16. A flat panel mounting system, comprising:
a front panel and a mating rear panel;
the front panel and the rear panel being adjustably connectable with one another by at least two side tabs;
at least one retaining feature extending from a lower portion of at least one of the front and the rear panels toward another of the front and the rear panels to form a base for supporting at least one peripheral electronic device thereon, and the front panel, the rear panel, the at least one retaining feature and the at least two side tabs together forming a housing which defines an internal recess;
at least the front panel having a plurality of mounting apertures therein for securing the housing to a flat panel monitor;
a mounting bracket for attachment to a support surface by at least one fastener; the rear panel of the housing having a hook which facilitates attachment of the housing to a mounting bracket attached to the support surface;
a removable locking member, being received by the mounting bracket, for preventing the housing from becoming inadvertently separated from the mounting bracket;
the housing being open on a top side thereof to facilitate insertion and removal of at least one peripheral electronic device therefrom and being at least partially closed, on a remaining five sides thereof, so as to facilitate retaining the at least one peripheral electronic device within the housing, and the internal recess being sized for accommodating the at least one peripheral electronic device therein, on the at least one retaining feature, between the flat panel monitor and the support surface; and
the flat panel monitor,
wherein the front panel includes four separate adjustable TV mounts which are securable adjacent a respective corner of the front panel by at least one fastener, and the four adjustable TV mounts are securable to the flat panel monitor for coupling the flat panel monitor to the mounting device.

17. The mounting device according to claim 16, wherein, when the flat panel monitor is of a first size, the four adjustable TV mounts are installed closer to a central region of the front panel, while when the flat panel monitor is of a second size greater than the first size, the four adjustable TV mounts are installed further away from the central region of the front panel.

18. The mounting device according to claim 16, wherein a first set of fasteners secure each one of the four adjustable TV mounts to the front panel, and a second set of fasteners secures the flat panel monitor to each respective one of the four adjustable TV mounts.

19. A method of attaching a flat panel monitor to a mounting device, the method comprising:
having separate front and rear panels;
adjustably connecting the front panel and the rear panel with one another by at least two side tabs; and at least one retaining feature extending from a lower portion of at least one of the front and the rear panels toward another of the front and the rear panels to form a base for supporting at least one peripheral electronic device thereon, and the front panel, the rear panel, the at least one retaining feature and the at least two side tabs together forming a housing which defines an internal recess; the rear panel of the housing having a hook which facilitates attachment of the housing to a mounting bracket desired support surface;
securing the front panel to the flat panel monitor by a plurality of mounting apertures of the front panel;
using at least one fastener to mount a mounting bracket to a desired surface by at least one fastener;
hanging the housing and the flat panel monitor on the mounting bracket and installing a removable locking member for preventing the housing from becoming inadvertently separated from the mounting bracket; and the housing being open on a top side thereof to facilitate insertion and removal of at least one peripheral electronic device therefrom and being sufficiently closed, on a remaining five sides thereof, so as to facilitate retaining the at least one peripheral electronic device within the housing, and the internal recess being sized for accommodating the at least one peripheral electronic device therein, on the at least one retaining feature, between the flat panel monitor and the desired surface, wherein the top side of the housing is completely unobstructed so as to facilitate unhindered access to the internal recess and at least one peripheral electronic device to be located within the housing.

\* \* \* \* \*